US012726773B2

(12) United States Patent
Barsukou

(10) Patent No.: US 12,726,773 B2
(45) Date of Patent: Sep. 1, 2026

(54) MEMS SENSOR WITH A THIN REGION

(71) Applicant: SKYWORKS SOLUTIONS, INC., Irvine, CA (US)

(72) Inventor: Siarhei Dmitrievich Barsukou, Takarazuka (JP)

(73) Assignee: SKYWORKS SOLUTIONS, INC., Irvine, CA (US)

(*) Notice: Subject to any disclaimer, the term of this patent is extended or adjusted under 35 U.S.C. 154(b) by 659 days.

(21) Appl. No.: 18/124,788

(22) Filed: Mar. 22, 2023

(65) Prior Publication Data

US 2023/0312334 A1 Oct. 5, 2023

Related U.S. Application Data

(60) Provisional application No. 63/362,251, filed on Mar. 31, 2022, provisional application No. 63/362,252, filed on Mar. 31, 2022.

(51) Int. Cl.
*B81B 3/00* (2006.01)
*B81C 1/00* (2006.01)
(Continued)

(52) U.S. Cl.
CPC ........... *H04R 17/02* (2013.01); *B81B 3/0021* (2013.01); *B81B 3/0027* (2013.01); *B81C 1/0015* (2013.01); *H04R 1/028* (2013.01); *H04R 7/06* (2013.01); *H04R 31/006* (2013.01); *H10N 30/30* (2023.02); *H10N 30/872* (2023.02); *B81B 2201/0257* (2013.01); *B81B 2203/0118* (2013.01); *B81B 2203/0127* (2013.01); *B81B 2203/0307* (2013.01); *B81B 2203/0315* (2013.01); *B81B 2203/04* (2013.01);
(Continued)

(58) Field of Classification Search
CPC ........ H04R 17/02; H04R 7/06; B81B 3/0021; B81B 2201/0257; B81B 2203/0118; B81B 2203/0127
See application file for complete search history.

(56) References Cited

U.S. PATENT DOCUMENTS 8,531,088 B2 * 9/2013 Grosh .................. H10N 30/302 310/368
10,170,685 B2 * 1/2019 Grosh .................... H04R 17/00
(Continued)

OTHER PUBLICATIONS

Lo et al., "Development of a No-back-plate SOI MEMS Condenser Microphone", IEEE (2015), Transducers 2015, Anchorage, Alaska, USA, Jun. 21-25, 2015, pp. 1085-1088.
(Continued)

*Primary Examiner* — Jarrett J Stark
(74) *Attorney, Agent, or Firm* — Lando & Anastasi, LLP

(57) ABSTRACT

A piezoelectric microelectromechanical systems microphone is provided comprising a sensor, an anchor region at which the sensor is supported by a substrate, a first region of the sensor adjacent to the anchor region, the first region having at least one piezoelectric layer and at least one electrode, and a second region of the sensor, the second region being adjacent to the first region, having at least one piezoelectric layer and at least one electrode, and having a thickness less than the thickness of the first region. A method for manufacturing a piezoelectric microelectromechanical systems microphone is also provided.

20 Claims, 13 Drawing Sheets

(51) Int. Cl.

| | |
|---|---|
| ***H04R 1/02*** | (2006.01) |
| ***H04R 7/06*** | (2006.01) |
| ***H04R 17/02*** | (2006.01) |
| ***H04R 31/00*** | (2006.01) |
| ***H10N 30/30*** | (2023.01) |
| ***H10N 30/87*** | (2023.01) |
| *H04M 1/02* | (2006.01) |
| *H10N 30/05* | (2023.01) |
| *H10N 30/50* | (2023.01) |

(52) U.S. Cl.
CPC .................. *B81C 2201/013* (2013.01); *B81C 2201/0178* (2013.01); *H04M 1/026* (2013.01); *H04R 2201/003* (2013.01); *H04R 2499/11* (2013.01); *H10N 30/05* (2023.02); *H10N 30/503* (2023.02)

(56) References Cited

U.S. PATENT DOCUMENTS 11,099,078 B1 * 8/2021 Littrell .................... G01K 1/14
11,387,403 B2 * 7/2022 Rufer .................. H10N 30/508
11,653,570 B2 * 5/2023 Yeon ..................... H10N 39/00 310/311
11,665,968 B2 * 5/2023 Grosh ................... H04R 17/02 381/173
12,058,939 B2 8/2024 Grosh et al.
12,101,601 B2 * 9/2024 Chen ....................... H04R 7/06
12,329,033 B2 * 6/2025 Qian ....................... H04R 7/10
12,391,546 B1 * 8/2025 Qian ..................... H10N 30/06
2010/0254547 A1 * 10/2010 Grosh .................. B81B 3/0021 381/114
2012/0234093 A1 9/2012 Black et al.
2012/0250909 A1 * 10/2012 Grosh ................... H10N 30/05 381/174
2017/0186940 A1 6/2017 Bevilacqua et al.
2018/0337325 A1 11/2018 Han et al.
2019/0177155 A1 * 6/2019 Qian .................. B81C 1/00666
2019/0289405 A1 * 9/2019 Littrell .................. H04R 3/007
2022/0173301 A1 * 6/2022 Xiong ................. H10N 30/871
2022/0232328 A1 * 7/2022 Mawatari ............ H04R 31/003
2022/0408185 A1 * 12/2022 Barsukou ............. B81B 3/0021
2023/0039743 A1 * 2/2023 Hui ....................... B81B 3/0072
2023/0072672 A1 * 3/2023 Chen ..................... H04R 17/02
2023/0105699 A1 * 4/2023 Chen .................. B81C 1/00182 257/414
2023/0127983 A1 * 4/2023 Chen ..................... H04R 19/04 381/173
2023/0143656 A1 * 5/2023 Littrell .................... H04R 7/06 257/415
2023/0188896 A1 * 6/2023 Barsukou ................ H04R 7/06 381/91
2023/0210010 A1 * 6/2023 Enomoto ............ H10N 30/853 310/311
2023/0243710 A1 * 8/2023 Jomori ................ H10N 30/082 73/702
2023/0319484 A1 * 10/2023 Barsukou .............. H04R 17/02 381/91
2023/0337544 A1 10/2023 Grosh et al.
2023/0363280 A1 * 11/2023 Sakai .................. H10N 30/074
2023/0388714 A1 * 11/2023 Boyd ....................... H04R 7/06
2024/0397828 A1 * 11/2024 Lin ..................... H10N 30/063
2024/0425353 A1 12/2024 Leahy et al.
2025/0374830 A1 * 12/2025 Mondal ............... H10N 30/853

OTHER PUBLICATIONS

Shah et al., “Design Approaches of MEMS Microphones for Enhanced Performance”, Hindawi, Journal of Sensors, vol. 2019, Article ID 9294528, Mar. 6, 2019, 26 pages.
Tseng et al., “Implementation of Piezoelectric MEMS Microphone for Sensitivity and Sensing Range Enhancement”, IEEE (2020), IEEE MEMS 2020, Vancouver, Canada, Jan. 18-22, 2020, pp. 845-848.
Yamashita et al., “Diaphragm deflection control of piezoelectric ultrasonic microsensors for sensitivity improvement”, Sensors and Actuators A 139 (2007), pp. 118-123.

* cited by examiner

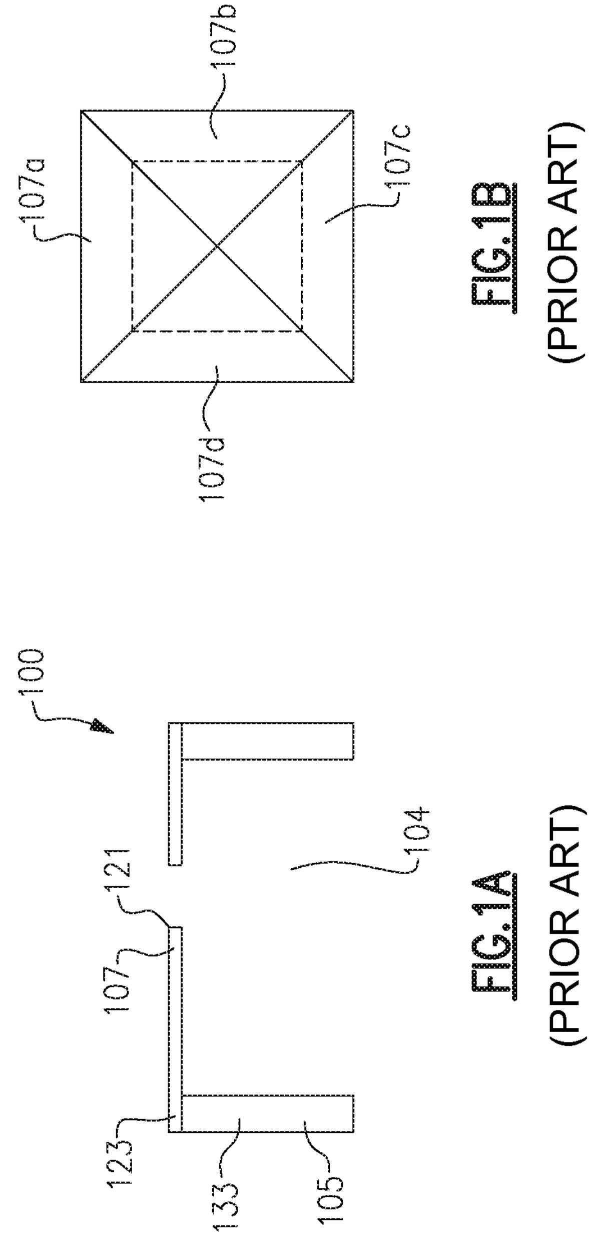
FIG.1B
(PRIOR ART)
FIG.1A
(PRIOR ART)
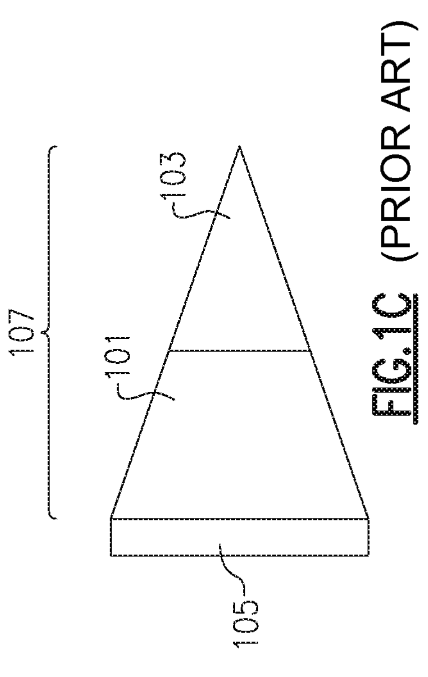
FIG.1C (PRIOR ART)

| | Conventional | Improved |
|---|---|---|
| dr factor | 0.7/0.7 | 0.65/0.85 |
| Vout, mV | 1.00/1.00 | 1.07/1.27 |
| Fr, kHz | 13.993 | 11.074 |
FIG.6E
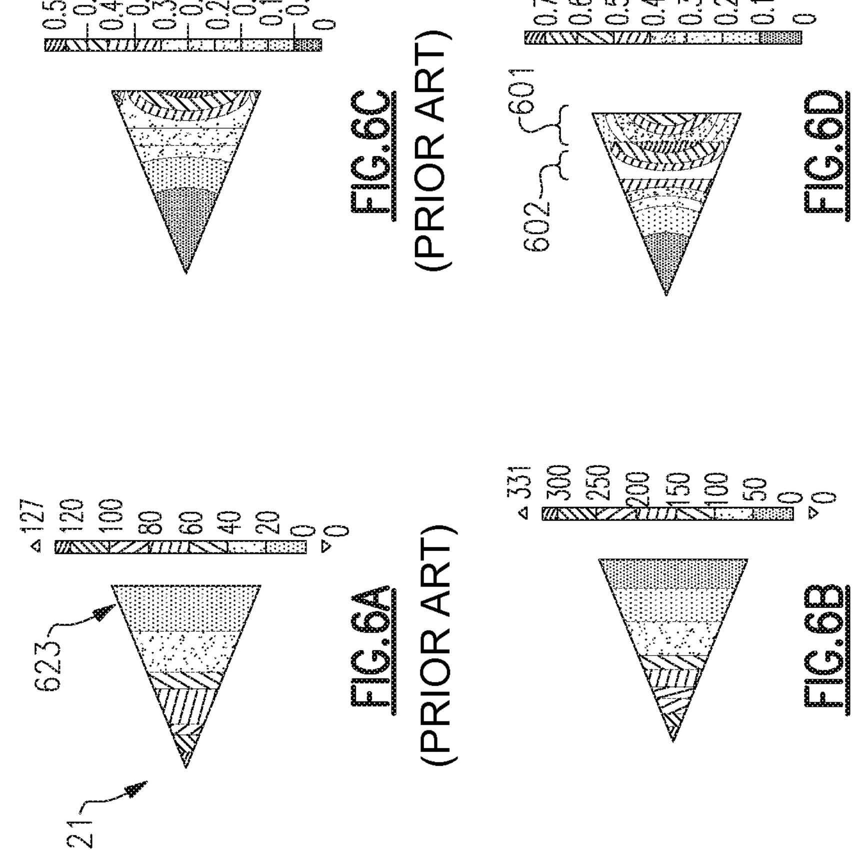
FIG.6A (PRIOR ART)
FIG.6B
FIG.6C (PRIOR ART)
FIG.6D

CONVENTIONAL kHz

F0 13.993

F1 56.431

F1 57.803

F3 131.760

PRESENT DESIGN kHz 11.074

MEMS SENSOR WITH A THIN REGION

CROSS-REFERENCE TO RELATED APPLICATIONS

This application claims priority under 35 U.S.C. § 119(e) to U.S. Provisional Patent Application Ser. No. 63/362,252, titled "A MEMS SENSOR WITH A THIN REGION," filed Mar. 31, 2022 and to U.S. Provisional Patent Application Ser. No. 63/362,251, titled "A MEMS SENSOR WITH TWO COMPLIANCES," filed Mar. 31, 2022, the subject matter of each being incorporated herein by reference in its entirety for all purposes.

BACKGROUND

Field

Aspects and embodiments disclosed herein relate to piezoelectric microelectromechanical systems microphones with cantilevered and/or membrane sensors.

Description of the Related Technology

A MEMS microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example, when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination.

Piezoelectric MEMS microphones work on the principle of piezoelectric effect, so that they convert acoustic signals to electric signals when sound waves vibrate the piezoelectric sensor. The sound waves bend the piezoelectric film layers of a cantilevered sensor or a membrane sensor, causing stress and strain, resulting in charges being generated in the piezoelectric film layers. The charges are converted to voltage as an output signal, by the placement of one or more electrodes on the piezoelectric film layers.

SUMMARY

Arrangements described herein are directed to altering the compliance between two regions of a sensor for improving the performance of a piezoelectric microelectromechanical systems (MEMS) microphone. As will be described herein, this may either be achieved by a difference in thickness between the regions, or a difference in materials used to form the regions.

According to one embodiment there is provided a piezoelectric microelectromechanical systems microphone comprising a sensor, an anchor region at which the sensor is supported by a substrate, a first region of the sensor adjacent to the anchor region, the first region having at least one piezoelectric layer and at least one electrode, and a second region of the sensor, the second region being adjacent to the first region, having at least one piezoelectric layer and at least one electrode, and having a thickness less than the thickness of the first region.

In one example the piezoelectric layer of the first region is the same as the piezoelectric layer of the second region.

In one example the microphone further comprises a third region of the sensor having at least one layer of material.

In one example the at least one layer of material is a piezoelectric material.

In one example the at least one layer of material is a metal.

In one example the at least one layer of material is a low density material.

In one example the third region has a thickness equal to the thickness of the second region.

In one example the third region has a thickness less than the thickness of the second region. In one example the third region has a thickness greater than the thickness of the second region.

In one example the third region comprises at least one corrugation.

In one example the second region comprises two piezoelectric layers and three electrode layers, where one of the electrode layers is a middle electrode located between the two piezoelectric layers.

In one example the first region comprises two piezoelectric layers and three electrode layers, where one of the electrode layers is a middle electrode located between the two piezoelectric layers.

In one example the middle electrode of the first region and the middle electrode of the second region are the same electrode layer.

In one example the first region comprises four electrodes, two piezoelectric layers and at least one layer of non-piezoelectric material.

In one example one of the electrode layers of the first region is connected to an upper electrode of the second region and another one of the electrode layers of the first region is connected to a lower electrode of the second region.

In one example the first region comprises five electrode layers and four piezoelectric layers.

In one example one of the electrode layers of the first region is connected to an upper electrode of the second region and another one of the electrode layers of the first region is connected to a lower electrode of the second region.

In one example the at least one electrode of the first region has an electrode optimization parameter of 0.65.

In one example the at least one electrode of the second region has an electrode optimization parameter of 0.85.

In one example the at least one piezoelectric layer of the first region and/or the at least one piezoelectric layer of the second region is composed of aluminum nitride.

In one example the at least one electrode of the first region is composed of the same metal as the at least one electrode of the second region.

In one example the at least one electrode of the first region is composed of a different metal than the at least one electrode of the second region.

In one example the first region comprises three electrodes, two of which are connected in parallel.

In one example the difference in thickness between the first and second region is negligible compared to the length of the first region.

In one example the sensor is a cantilever sensor.

In one example the sensor is a membrane sensor.

In one example the sensor has a triangular shape.

In one example the microphone comprises four sensors such that the four sensors form a quadrilateral microphone.

In one example the four sensors are disposed over a cavity and the cavity has a quadrilateral cross-section.

According to another embodiment there is provided a method for manufacturing a piezoelectric microelectromechanical systems microphone, the method comprising depositing at least one piezoelectric layer on a substrate, depositing at least one electrode at each of first and second regions, the at least one electrode and at least one piezoelectric layer being alternated, and the at least one electrode and at least one piezoelectric layer defining a sensor such that the second region has a thickness less than the thickness of the first region, and etching the substrate to define a cavity over which the sensor is located.

In one example the method further comprises oxidizing the substrate before depositing the at least one piezoelectric layer and the at least one electrode layer.

In one example the depositing of the at least one piezoelectric layer further includes depositing the at least one piezoelectric layer at a third region.

According to another embodiment there is provided a wireless mobile device comprising one or more antennas, a front end system that communicates with the one or more antennas and one or more piezoelectric microelectromechanical systems microphones, each microphone including a sensor, an anchor region at which the sensor is supported by a substrate, a first region of the sensor adjacent to the anchor region, the first region having at least one piezoelectric layer and at least one electrode, and a second region of the sensor, the second region being adjacent to the first region, having at least one piezoelectric layer and at least one electrode, and having a thickness less than the thickness of the first region.

According to another embodiment there is provided a piezoelectric microelectromechanical systems microphone comprising a sensor, an anchor region at which the sensor is supported by a substrate, a first region of the sensor adjacent to the anchor region having a first compliance, the first region having at least one piezoelectric layer and at least one electrode, and a second region of the sensor, the second region being adjacent to the first region, having at least one piezoelectric layer and at least one electrode, the second region having a second compliance, the first and second compliances being different. In one example the at least one piezoelectric layer of the second region of the sensor has thickness less than the thickness of the at least one piezoelectric layer of the first region of the sensor.

In one example the at least one electrode of the second region of the sensor has thickness less than the thickness of the at least one piezoelectric layer of the first region of the sensor.

In one example the second compliance is greater than the first compliance.

In one example the at least one electrode of the second region of the sensor has a higher compliance than the at least one electrode of the first region.

In one example the at least one piezoelectric layer of the second region of the sensor has a higher compliance than the at least one piezoelectric layer of the first region.

In one example the piezoelectric layer of the first region is the same as the piezoelectric layer of the second region.

In one example the microphone further comprises a third region of the sensor, having at least one layer of material.

In one example the at least one layer of material is a piezoelectric material.

In one example the at least one layer of material is a metal.

In one example the at least one layer of material is a low density material.

In one example the third region has a thickness equal to the thickness of the second region.

In one example the third region has a thickness less than the thickness of the second region. In one example the third region has a thickness greater than the thickness of the second region.

In one example the third region comprises at least one corrugation.

In one example the second region comprises two piezoelectric layers and three electrode layers, where one of the electrode layers is a middle electrode located between the two piezoelectric layers.

In one example the first region comprises two piezoelectric layers and three electrode layers, where one of the electrode layers is a middle electrode located between the two piezoelectric layers.

In one example the middle electrode of the first region and the middle electrode of the second region are the same electrode layer.

In one example the first region comprises four electrodes, two piezoelectric layers, and at least one layer of non-piezoelectric material.

In one example one of the electrode layers of the first region is connected to an upper electrode of the second region and another one of the electrode layers of the first region is connected to a lower electrode of the second region.

In one example the first region comprises five electrode layers and four piezoelectric layers.

In one example one of the electrode layers of the first region is connected to an upper electrode of the second region and another one of the electrode layers of the first region is connected to a lower electrode of the second region.

In one example the at least one electrode of the first region has an electrode optimization parameter of 0.65.

In one example the at least one electrode of the second region has an electrode optimization parameter of 0.85.

In one example the at least one piezoelectric layer of the first region and/or the at least one piezoelectric layer of the second region is composed of aluminum nitride.

In one example the at least one electrode of the first region is composed of the same metal as the at least one electrode of the second region.

In one example the at least one electrode of the first region is composed of a different metal than the at least one electrode of the second region.

In one example the first region comprises three electrodes, two of which are connected in parallel.

In one example the difference in thickness between the first and second region is negligible compared to the length of the first region.

In one example the sensor is a cantilever sensor.

In one example the sensor is a membrane sensor.

In one example the sensor has a triangular shape.

In one example the microphone comprises four sensors such that the four sensors form a quadrilateral microphone.

In one example four sensors are disposed over a cavity and the cavity has a quadrilateral cross-section.

According to another embodiment there is provided a method for manufacturing a piezoelectric microelectromechanical systems microphone, the method comprising depositing at least one piezoelectric layer on a substrate, depositing at least one electrode at each of first and second regions, the at least one electrode and at least one piezoelectric layer being alternated, the at least one electrode and at least one piezoelectric layer defining a sensor, where the sensor has a different compliance at the first and second regions, and etching the substrate to define a cavity over which the sensor is located.

In one example the method further comprises oxidizing the substrate before depositing the at least one piezoelectric layer and the at least one electrode layer.

In one example the depositing of the at least one piezoelectric layer further includes depositing the at least one piezoelectric layer at a third region.

According to another embodiment there is provided a wireless mobile device comprising one or more antennas, a front end system that communicates with the one or more antennas and one or more piezoelectric microelectromechanical systems microphones, each microphone including a sensor, an anchor region at which the sensor is supported by a substrate, a first region of the sensor adjacent to the anchor region and having a first compliance, the first region having at least one piezoelectric layer and at least one electrode, and a second region of the sensor, the second region being adjacent to the first region, having at least one piezoelectric layer and at least one electrode, and having a second compliance, the first and second compliances being different.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures:

FIG. 1A is a known arrangement of a microphone;

FIG. 1B is a sensor arrangement of a known microphone;

FIG. 1C is a sensor of a known microphone;

FIG. 6A shows the displacement of a known sensor;

FIG. 6B shows the displacement of a sensor according to aspects of the present disclosure;

FIG. 6C shows the stress of a known sensor;

FIG. 6D shows the stress of a sensor according to aspects of the present disclosure;

FIG. 6E shows a table of values of a known sensor and a sensor according to aspects of the present disclosure;

FIG. 8 shows high order displacement modes of a known sensor and a sensor according to aspects of the present disclosure according to aspects of the present disclosure;

DETAILED DESCRIPTION

Figures 2A, 2B:
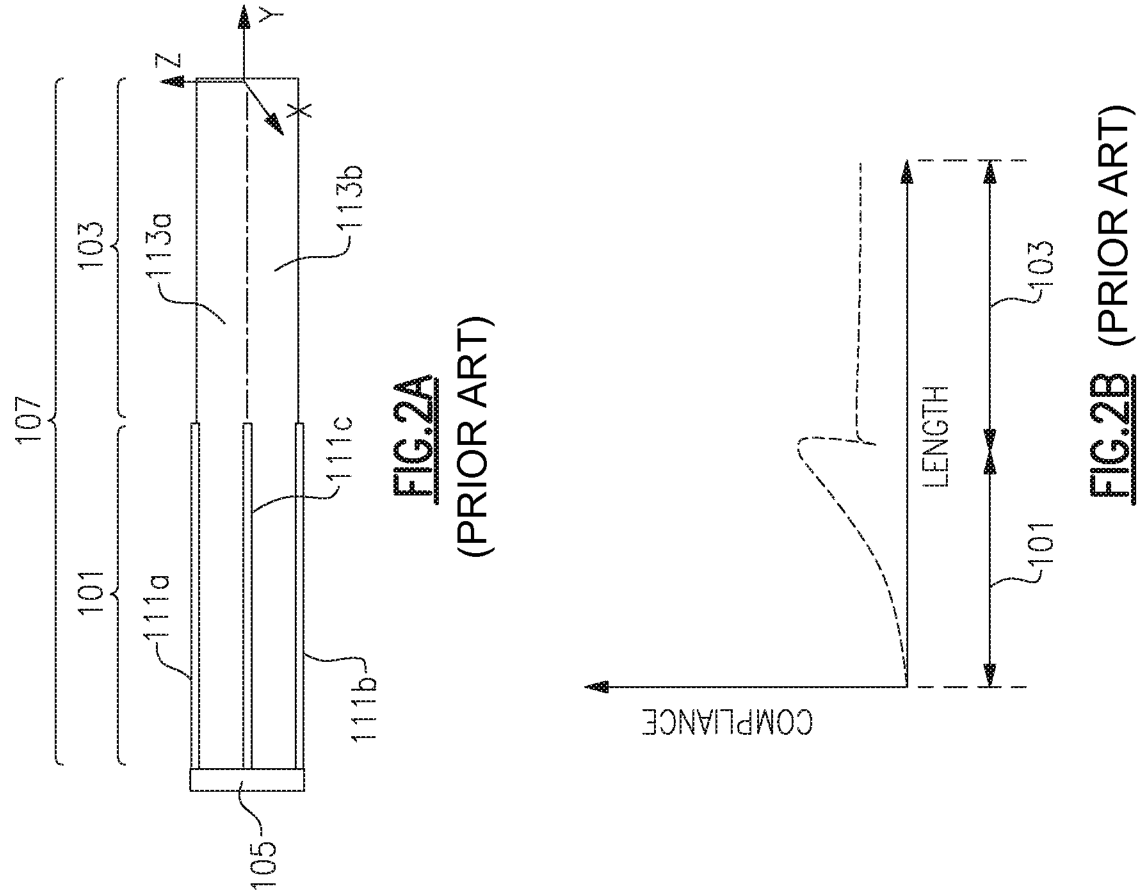
FIG. 2A is a known sensor arrangement of a microphone.
FIG. 2B is a graph showing compliance of a known sensor.

Arrangements described herein are directed to altering the compliance between two regions of a sensor for improving the performance of a piezoelectric microelectromechanical systems (MEMS) microphone. As will be described herein, this may either be achieved in embodiments by a difference in thickness between the regions, or a difference in materials used to form the regions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

FIGS. 1A-1C show a known implementation of a piezoelectric microelectromechanical systems (MEMS) microphone 100 (hereinafter the "microphone").

FIG. 1A shows a cross-sectional view of the microphone 100. As shown, the microphone 100 is cantilever microphone. The microphone 100 comprises a substrate 133. The substrate 133 is optionally made of silicon. The substrate 133 has side walls 105 arranged such that they extend perpendicular to the length of the sensor 107. The microphone comprises a cavity 104 defined by the side walls 105. The microphone may comprise one or more sensors. The sensor 107 is composed of at least one piezoelectric layer, and at least one electrode, not shown in this simplified illustration. The microphone comprises an anchor region at which the sensor 107 is coupled to and supported by one of the side walls 105. The sensor 107 is supported by the substrate at the anchor region, such that the sensor is cantilevered and extends between a fixed end 123 and a free end 121. Although the microphone is illustrated with two cantilevered sensors, extending from opposite walls, such that the free end of one cantilevered sensor is separated from the free end of the second cantilevered sensor by a gap centered over the cavity 104, it will be noted that there may only be one cantilevered sensor, such that it extends across the cavity, and is separated from the second substrate wall by a gap. The size of the gap between the free ends of the one or more sensor is preferably minimized, such that air flow into and out of the cavity is minimized, thus increasing sensitivity of the device.

FIG. 1B illustrates a plan view of the microphone. As shown, the cantilevered sensor may be triangular in shape, such that four cantilevered sensors 107*a*, 107*b*, 107*c*, and 107*d* form a square. In this arrangement the cavity has a square shape, such that the sensors are centered over the cavity 104. However, it will be appreciated that in any of the embodiments of the disclosure, as described herein, may have a sensor of other shapes, such as rectangular, or circular, or any other polygon. Although the sensors are illustrated as extending across the cavity, such that they are perpendicular to the surface of the substrate, i.e., are flat, it will be noted that the sensor may bend into or out of the cavity. The dashed line shows the outline of the cavity underneath the sensor, such that the anchor region is shown, and thus the substrate walls 105 are also shown. The sensors overlap the substrate walls at the anchor region.

FIG. 1C shows a plan view of one cantilever sensor. As described in relation to FIG. 1A, the microphone may comprise only one sensor 107. The sensor 107 comprises an active region 101 and a passive region 103. The active region 101 comprises at least one electrode, not shown here, such that the electrode is deposited on the at least one piezoelectric layer. The electrode collects charge generated from the piezoelectric layer when it undergoes bending and stress as a result of acoustic pressure applied to the surface of the sensor. The electrode is shaped and sized such that it is located at the regions with the maximum stress. The electrode covers only the active region 101, adjacent to the anchor region, which is where the piezoelectric layer undergoes the most stress and strain due to its fixation to the substrate wall 105 and the anchor region. Therefore an electrode located solely at the anchor region 101 of the sensor 107 results in the collection of the most energy per unit area, resulting in a higher output voltage. The passive region 103 of the sensor does not comprise an electrode, as the stress and strain are less than in the active region as it is adjacent to and includes the free end of the sensor 107.

FIG. 2A shows a more detailed cross-sectional view of the sensor as described in relation to FIGS. 1A-1C. As described the sensor may comprise at least one piezoelectric layer, and the active region 101 comprises at least one electrode. In FIG. 2A the arrangement is shown comprising two piezoelectric layers, 113*a* and 113*b*. The arrangement of FIG. 2A comprises an active region having three electrode layers, 111*a*, 111*b*, and 111*c*, such that in the active region 101 the piezoelectric layers and electrode layers are alternated. There is an upper electrode 111*a*, a lower electrode 111*b*, and a middle electrode 111*c*. As descried above, the passive region 103 does not comprise electrode layers. The passive region comprises a piezoelectric layer, which may be manufactured as two stacked layers which mechanically act as a single piezoelectric layer. The active region is adjacent to the substrate wall 105. As shown, in the known arrangement, the active region and passive region comprise the same thickness of piezoelectric layers, such that sensor 107 is the same thickness along its entire length.

FIG. 2B shows the compliance of the sensor 107, comprising an active region 101 and a passive region 103, as described in relation to FIG. 1B. As shown, the active region 101 has a compliance which increases along the length of the sensor, defined by the length from the anchor region. The compliance drops at the join of the active region 101 and passive region 103. The compliance does not increase in the passive region 103 and remains at a steady value. The compliance is lower in the passive region 103 than the maximum compliance in the active region 101 due to the passive region having a higher stiffness than the active region. The sensor overall has a low compliance. The active region has a low compliance proximate the anchor region due to the electrode covering the active region. The passive region may have a reduced compliance as a result of mechanical properties of the region. The properties may be formed using a corrugated region in the sensor, or using a material with a higher Young's modulus than the piezoelectric material of the active region. The lower compliance of the passive region results in no bending, or substantially less bending than in the active region. The low compliance results in an increased effectivity of the active region, as bending due to application of external sound will be concentrated at the active region, and therefore the stress and charge induced will be higher than if the active region had a high compliance.

Figure 3A:
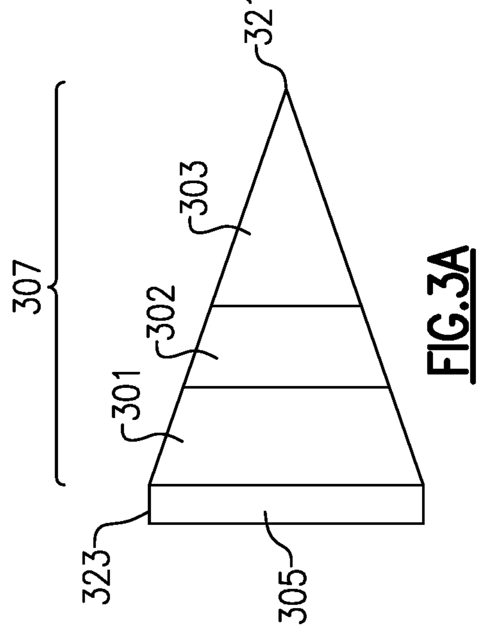
FIG. 3A is a sensor according to aspects of the present disclosure.
Figure 3B:
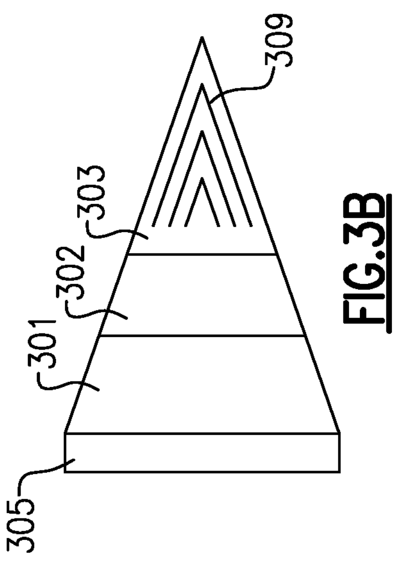
FIG. 3B is a sensor according to aspects of the present disclosure.

FIGS. 3A and 3B show a plan view of an embodiment of a sensor in accordance with the present disclosure.

FIG. 3A shows a sensor 307 which comprises three regions. The sensor comprises a first region 301 adjacent to the substrate wall, 305, and therefore adjacent to the anchor region. The first region comprises at least one electrode, and at least one piezoelectric layer. The sensor also comprises a second region 302, the second region being adjacent to the first region 301. The second region comprises at least one electrode and at least one piezoelectric layer. The first region and second region define the active region of the sensor. The sensor may also comprise a third region 303, as shown in FIG. 3A, where the third region is adjacent to the second region 302 and comprises the free end 321 of the sensor 307. The third region defines the passive region of the sensor and does not comprise any electrodes. The third region 303 may be composed of piezoelectric material, metal, or of a stiff material having a low density. As described above, the active region collects the charge generated when the sensor is bent due to application of acoustic pressure to the sensor. Acoustic pressure is applied to the passive region, so that the sensor bends more as a result of the application of the acoustic pressure, and therefore more charge is generated in the first and second regions.

FIG. 3B shows another embodiment of a sensor in accordance with the present disclosure, wherein the sensor comprises the same regions as described in FIG. 3A. The sensor of FIG. 3B further comprises at least one corrugation 309, also referred herein as a "slit," which has the effect of increasing the stiffness the third region 303. The third region may therefore be composed of a low density material, whose stiffness may be increased by the use of corrugations 309. It is advantageous for the passive region to have a high stiffness such that the compliance of the passive region is reduced, and the force is exerted in the active region, rather than the passive region bending and not generating charge. Whereas, if the passive region has a high compliance, the passive region bends as a result of application of acoustic pressure. This would result in the pressure being released in the passive region, at which there are no electrodes to collect charge from the bending piezoelectric material, instead of bending being applied to the active region. This results in reduced stress in the active region, and degraded sensitivity.

Figure 4C:
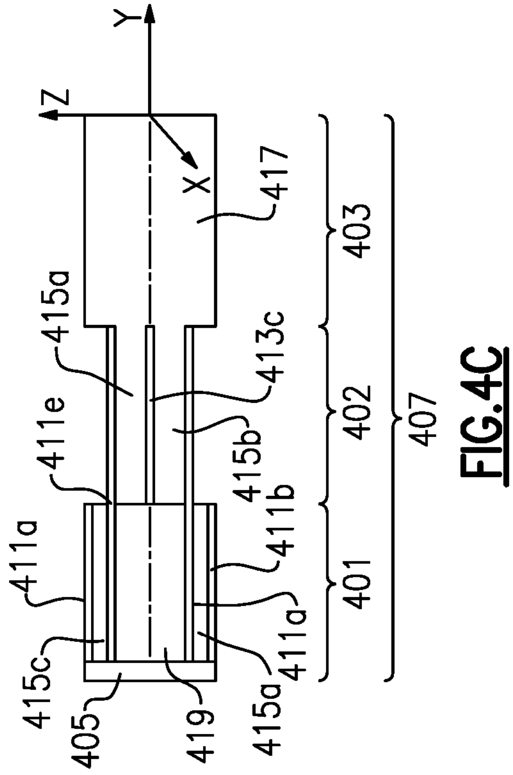
FIG. 4A-4D are sensors according to aspects of the present disclosure.
Figure 4D:
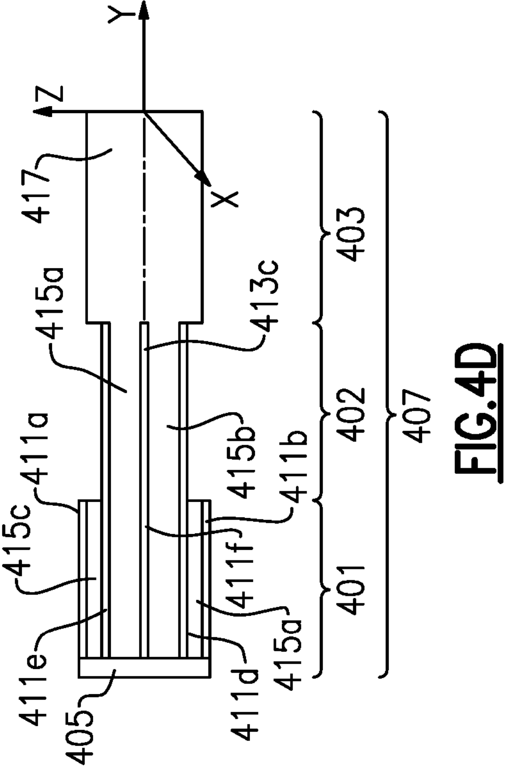

In some embodiments, the second region of the sensor may have a thickness that is less than the thickness of the first region, such that the second region has a greater compliance than the second region. The advantages of this increased compliance will be discussed in detail herein. The difference in thickness of the two regions may be realized by the piezoelectric layers of the second region being thinner than the piezoelectric layers of the first region, and the electrode layers may be the same thickness in the first and second regions. Embodiments in which this is the case will be described in relation to FIGS. 4A and 4B. In other embodiments, the second region may be thinner than the first region due to the first region comprising more layers of electrode and/or piezoelectric material. Such embodiments are shown in FIGS. 4C and 4D, wherein the sensor of FIG. 4C also has an additional material 419 in the first region, as will be described herein. In other embodiments, not illustrated, the first region may have a smaller thickness than the second, but the piezoelectric layers of the first and second regions may have the same thickness. In these embodiments, the electrode thickness of the second region may be smaller than the electrode thickness of the first region. This results in a thinner second region, such that the second region has a smaller compliance than the first region. FIGS. 4A, 4B, 4C, and 4D illustrate four embodiments, which will now be described in detail. In these embodiments, compliance of regions of the sensor is altered by selection of differing thicknesses, particularly having a second region away from the anchor region of lower thickness than a first region adjacent to the anchor region. In each embodiment the sensor 407 comprises a first region 401 and a second region 402, wherein the first and second regions define an active region, and the sensor 407 also comprises a third region 403, wherein the third region 403 defines a passive region. In each embodiment, as will be described in more detail herein, the second region 402 has a thickness less than the thickness of the first region 401. It will be appreciated that although the embodiments described herein comprise a third, passive, region, the sensor may comprise the active region without a passive region, i.e., the sensor may only comprise the first and second regions. It will be appreciated that the FIGS. 4A-4D are for illustrative purposes only, and the relative sizes of the features are not to scale. The piezoelectric layers of each of the embodiments descried in relation to FIGS. 4A-4D may be any piezoelectric material, such as AlN, or Sc(AlN), PZT or ZnO. The electrode layers may be any suitable material, such as aluminum or molybdenum. The electrodes may be composed of different materials within each region, for example, the upper and lower electrodes may be comprised of a different metal than the middle electrode in a region. This enables the sensor to be optimized, by improving compliance using different metals.

Figure 4A:
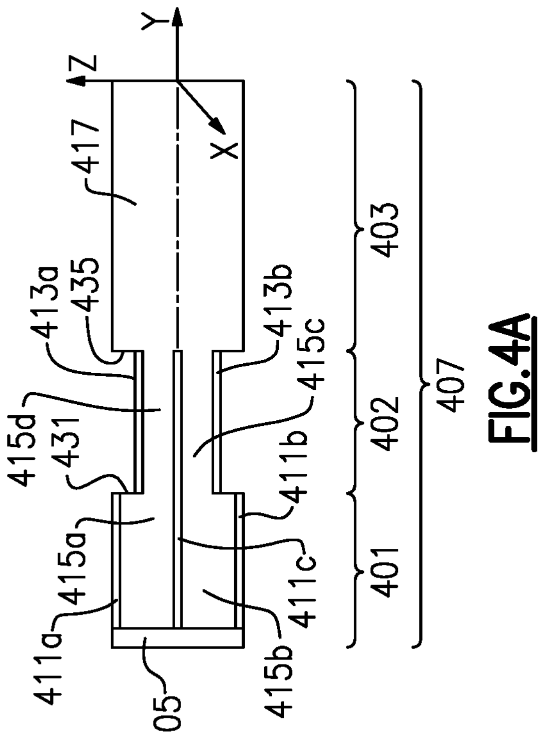

FIG. 4A shows a first embodiment. The first region 401 of the sensor is located adjacent to the substrate wall 405, i.e., the anchor region. The first region 401 comprises three electrodes, an upper electrode layer 411*a*, a lower electrode layer 411*b*, and a middle electrode layer 411*c*. The first region also comprises two piezoelectric layers 415*a* and 415*b*. The three electrode layers, and two piezoelectric layers are alternated, such that one piezoelectric layer 415*a* is sandwiched between the upper 411*a* and middle 411*c* electrode layers, and the other piezoelectric layer 415*b* is sandwiched between the middle 411*c* and lower 411*b* electrode layers.

The second region 402 of the sensor is located adjacent to the first region 401. The second region comprises three electrodes, an upper electrode layer 413*a*, a lower electrode layer 413*b*, and a middle electrode layer. The middle electrode layer may be the same electrode layer as 411*c* such that the middle electrode of the first and second regions have been deposited in the same step of the process, as described herein. In some embodiments, based on the desired output electrical performance the middle electrode of the first and second regions may be separated, such that there is no electrical contact between the two electrodes. Therefore, in those embodiments, the electrodes are mechanically connected. The electrodes may be electrically separated by mask etching. The electrical separation allows series connection between the active first and second regions. The series connection allows an increased output voltage. In other embodiments, the middle electrode of the first and second regions may be electrically and mechanically connected. The second region also comprises two piezoelectric layers, 415*c* and 415*d*. The two piezoelectric layers may be the same piezoelectric layers as the two piezoelectric layers of the first region, such that they are deposited in the same manufacturing step. Or the two piezoelectric layers may be different from those of the first region, such that the piezoelectric layers of the first and second regions are deposited separately. One of the piezoelectric layers is sandwiched between the upper and middle electrode layers. The other piezoelectric layer is sandwiched between the middle and lower electrode layers. The second region has a smaller thickness than the first region, such that the upper and lower surfaces of the sensor each have a vertical step 431 at the point of connection between the first and second regions. The vertical step is such that a side of the electrode 413*a* is in contact with a portion of a side of the piezoelectric layer 415*a*. Each of the two piezoelectric layers of the second region are thinner than each of the two piezoelectric layers of the first region. It will be appreciated that in the embodiments described herein, it is preferable for the thickness between the first and second regions to decrease in a step, rather than a gradual decrease in thickness. Otherwise, the sensor would not result in the advantageous the stress profile as described herein. The upper and lower electrodes of the first and second regions are not mechanically or electrically connected, although the electrodes may be deposited in the same manufacturing step. In some embodiments, the upper electrodes of both the first and second region, or the lower electrodes of both of the first and second region may be formed in two different steps, or may be formed using partial etching or using masks, as will be described herein.

The third region 403 of the sensor is located adjacent the second region 402. The third region 403 is composed of at least one layer of material 417, wherein the material may be a piezoelectric material, or may be composed of a metal, or may be another material, preferably having a low density and high stiffness. As described elsewhere, the third region may comprise corrugated portions, which are not shown in the cross-sectional view of FIG. 4A. In this embodiment, the third region has a thickness equal to the first region 401. The material 417 has a thickness equal to the combined thickness of the three piezoelectric layers of the first region. Therefore, the upper and lower surfaces of the sensor each have a vertical step 435 at the point of connection between the second and third regions. The vertical step is such that a side of the electrode 413a is in contact with a portion of a side of the material 417. The dashed line of FIGS. 4A-4D show the line of symmetry of the sensor, in the z direction, i.e., in the direction perpendicular to the flat cantilevered sensor.

Figure 4B:
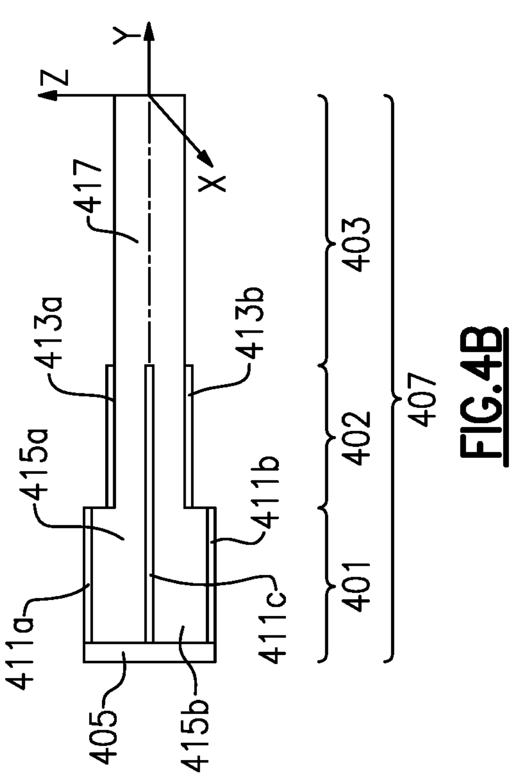

FIG. 4B shows a second embodiment. The first region 401 of the sensor is located adjacent to the substrate wall 405, i.e., the anchor region. The first region 401 comprises three electrodes, an upper electrode layer 411a, a lower electrode layer 411b, and a middle electrode layer 411c. The first region also comprises two piezoelectric layers 415a and 415b. The three electrode layers, and two piezoelectric layers are alternated, such that one piezoelectric layer 415a is sandwiched between the upper 411a and middle 411c electrode layers, and the other piezoelectric layer 415b is sandwiched between the middle 411c and lower 411b electrode layers.

The second region 402 of the sensor is located adjacent to the first region 401. The second region comprises three electrodes, an upper electrode layer 413a, a lower electrode layer 413b, and a middle electrode layer. The middle electrode layer may be the same electrode layer as 411c such that the middle electrode of the first and second regions have been deposited in the same step of the process, as described herein. In some embodiments, based on the desired output electrical performance the middle electrode of the first and second regions may be separated, such that there is no electrical contact between the two electrodes. Therefore, in those embodiments, the electrodes are mechanically connected. The electrodes may be electrically separated by mask etching. The electrical separation allows series connection between the active first and second regions. The series connection allows an increased output voltage. In other embodiments, the middle electrode of the first and second regions may be electrically and mechanically connected. The second region also comprises two piezoelectric layers. The two piezoelectric layers may be the same piezoelectric layers as the two piezoelectric layers of the first region, such that they are deposited in the same manufacturing step. Or the two piezoelectric layers may be different than those of the first region, such that the piezoelectric layers of the first and second regions are deposited separately. One of the piezoelectric layers is sandwiched between the upper and middle electrode layers. The other piezoelectric layer is sandwiched between the middle and lower electrode layers. The second region has a smaller thickness than the first region, such that the upper and lower surfaces of the sensor each have a vertical step at the point of connection between the first and second regions. The vertical step is such that a side of the electrode 413a is in contact with a portion of a side of the piezoelectric layer 415a. The upper and lower electrodes of the first and second regions are therefore not mechanically or electrically connected, although the electrodes may be deposited in the same manufacturing step. Each of the two piezoelectric layers of the second region are thinner than each of the two piezoelectric layers of the first region.

The third region 403 of the sensor is located adjacent to the second region 402. The third region 403 is composed of at least one layer of material 417, wherein the material may be a piezoelectric material, or may be composed a metal, or may be another material, preferably having a low density and high stiffness. As described elsewhere, the third region may comprise corrugated portions, which are not shown in the cross-sectional view of FIG. 4B. In this embodiment, the third region has a thickness equal to the second region, such that the third region has a thickness smaller than the thickness of the first region. The material 417 has a thickness equal to the combined thickness of the three piezoelectric layers of the second region.

The embodiment of FIG. 4B is advantageous for a higher resonant frequency of the microphone. The third region comprises a material of a thickness equal to the reduced thickness of the second region. This results in a higher frequency, as the inertia of the sensor is decreased, due to a lighter third region. This ensures that the resonant frequency is not degraded. Furthermore, the compliance of the embodiment of FIG. 4B is greater than an embodiment in which the third region is equal in thickness to the first region. Therefore, the sensor of FIG. 4B is able to bend more than if the sensor were thicker in the third region.

FIG. 4C shows a third embodiment. The first region 401 of the sensor is located adjacent to the substrate wall 405, i.e., the anchor region. The first region 401 comprises four electrodes, a first upper electrode layer 411a, a second upper electrode layer 411e, a first lower electrode layer 411b, and a second lower electrode layer 411d. The first region also comprises two piezoelectric layers 415c and 415d. One piezoelectric layer 415c is sandwiched between the first and second upper electrode layers 411a and 411e. The other piezoelectric layer 415d is sandwiched between the first and second lower electrode layers 411d and 411b. The first region further comprises one or more layers of material 419 located between the second upper electrode 411e and the second lower electrode layer 411d, such that the material 419 is located at the center of the sensor in the z direction. The material 419 may be a piezoelectric material, either the same as or different to the piezoelectric material of the layers 415c and 415d. Or the material 419 may be a non-piezoelectric material, as there is negligible stress at the center of the sensor. The material 419 is chosen dependent on the desired compliance of the sensor. For example, the material 419 may be a metal with a low Young's modulus (i.e., high compliance) such as aluminum, or may be a dielectric material, such as silicon dioxide. The material may be a high compliant material such as polydimethylsiloxane (PDMS), silicone glue, resin, low viscosity epoxy resin, or others.

The second region 402 of the sensor is located adjacent to the first region 401. The second region comprises three electrodes, an upper electrode layer, a lower electrode layer, and a middle electrode layer 413c. The upper electrode layer of the second region is in line with the second upper electrode layer 411e of the first region. The upper electrode layer of the second region and the second upper electrode layer 411e of the first region may be the same electrode layer, such that they are deposited in the same manufacturing step. The lower electrode layer of the second region is in line with the second lower electrode layer 411d of the first region. The lower electrode layer of the second region and the second lower electrode layer 411d of the first region may be the same electrode layer, such that they are deposited in the same manufacturing step. As described in relation to FIGS. 4A and 4B, the electrodes may be mechanically and electrically connected, or may be mechanically and electrically unconnected, even if they are manufactured in the same deposition step. The uncoupling may be performed using an etch mask.

The second region also comprises two piezoelectric layers, 415a and 415b. One of the piezoelectric layers 415a is sandwiched between the upper and middle electrode layers. The other piezoelectric layer 415b is sandwiched between the middle and lower electrode layers. The second region has a smaller thickness than the first region, such that the upper and lower surfaces of the sensor each have a vertical step at the point of connection between the first and second regions. Each of the two piezoelectric layers 415*a*, 415*b* of the second region may be thicker than each of the two piezoelectric layers 415*c*, 415*d* of the first region. However, the combined thickness of the two piezoelectric layers, 415*c* and 415*d*, and the material layer 419 of the first region is thicker than the combined thickness of the two piezoelectric layers, 415*a* and 415*b*, in the second region.

The third region 403 of the sensor is located adjacent to the second region 402. The third region 403 is composed of at least one layer of material 417, wherein the material may be a piezoelectric material, a metal, or another material, preferably having a low density and high stiffness. As described elsewhere, the third region may comprise corrugated portions, which are not shown in the cross-sectional view of FIG. 4C. In this embodiment, the third region has a thickness equal to the thickness of the first region, such that the third region has a thickness larger than the thickness of the second region, and therefore there is a vertical step between the second and third regions. The vertical step is such that a side of the electrode 413*c* is in contact with a portion of a side of material 417. The material 417 has a thickness equal to the combined thickness of the two piezoelectric layers and the material layer 419 of the first region. It will be appreciated that the third region may alternatively have a thickness equal to the thickness of the second region, i.e., a thickness smaller than the thickness of the first region, as described in FIG. 4B.

The embodiment of FIG. 4C is advantageous as the first region has an increased capacitance, compared to a sensor comprising piezoelectric layers and electrodes at the center of the sensor. It has been appreciated that as the center of the sensor does not generate charge as there is little stress, piezoelectric layers and electrodes are not required at the center of the sensor. A higher capacitance results in a higher output energy generated by the sensor. Due to the increase in capacitance, there is a less of a difference in stress amplitude between the first and second regions in the sensor of this embodiment. This may be advantageous in some sensors The capacitance of the first section is also greater than the capacitance of the third region.

FIG. 4D shows a fourth embodiment. The first region 401 of the sensor is located adjacent to the substrate wall 405, i.e., the anchor region. The first region 401 comprises five electrodes, a first upper electrode layer 411*a*, a second upper electrode layer 411*e*, a first lower electrode layer 411*b*, a second lower electrode layer 411*d*, and a middle electrode layer 411*f*. The first region also comprises four piezoelectric layers 415*a*, 415*b*, 415*c* and 415*d*. The piezoelectric layers and electrode layers are alternating, such that each of the piezoelectric layers is sandwiched between two electrodes, as shown in FIG. 4D.

The second region 402 of the sensor is located adjacent to the first region 401. The second region comprises three electrodes, an upper electrode layer, a lower electrode layer, and a middle electrode layer 413*c*. The middle electrode layer 413*c* of the second region may be the same electrode layer as the middle electrode of the first region, 411*f*, such that the middle electrode of the first and second regions are connected. The middle electrode of the first and second regions may be different electrode layers, such that they are deposited separately. As described in relation to FIGS. 4A and 4B, the electrodes may be mechanically and electrically connected, or may be mechanically and electrically unconnected, even if they are manufactured in the same deposition step. The uncoupling may be performed using an etch mask. The second region also comprises two piezoelectric layers, 415*a* and 415*b*. One of the piezoelectric layers 415*a* is sandwiched between the upper and middle electrode layers. The other piezoelectric layer 415*b* is sandwiched between the middle and lower electrode layers. The second region has a smaller thickness than the first region, such that the upper and lower surfaces of the sensor each have a vertical step at the point of connection between the first and second regions. Each of the piezoelectric layers 415*a*, 415*b* of the first region is substantially the same thickness as each of the piezoelectric layers 415*a*, 415*b* of the second region. However, the combined thicknesses of the four piezoelectric layers of the first region is greater than the combined thickness of the two piezoelectric layers of the second region.

The third region 403 of the sensor is located adjacent to the second region 402. The third region 403 is composed of at least one layer of material 417, wherein the material may be a piezoelectric material, a metal, or another material, preferably having a low density and high stiffness. As described elsewhere, the third region may comprise corrugated portions, which are not shown in the cross-sectional view of FIG. 4D. In this embodiment, the third region has a thickness equal to the first region, such that the third region has a thickness larger than the thickness of the second region, and therefore there is a vertical step between the second and third regions. The vertical step is such that sides of the electrodes 411*d*, 411*e* are in contact with portions of a side of the material 417. The material 417 has a thickness equal to the combined thickness of the four piezoelectric layers of the first region. It will be appreciated, that the third region may alternatively have a thickness equal to the thickness of the second region, i.e., a thickness smaller than the thickness of the first region, as described in FIG. 4B.

The embodiment of FIG. 4D provides the advantage that the compliance of the first region is increased due to the additional two electrode layers. This may result in an increased deflection at the first region, which consequently may result in an increase in stress of the sensor adjacent the anchor region. The increase in compliance is dependent on the metal which forms the electrode. Therefore, the sensor can be optimized using different electrodes, depending on the result required.

Figure 4E:
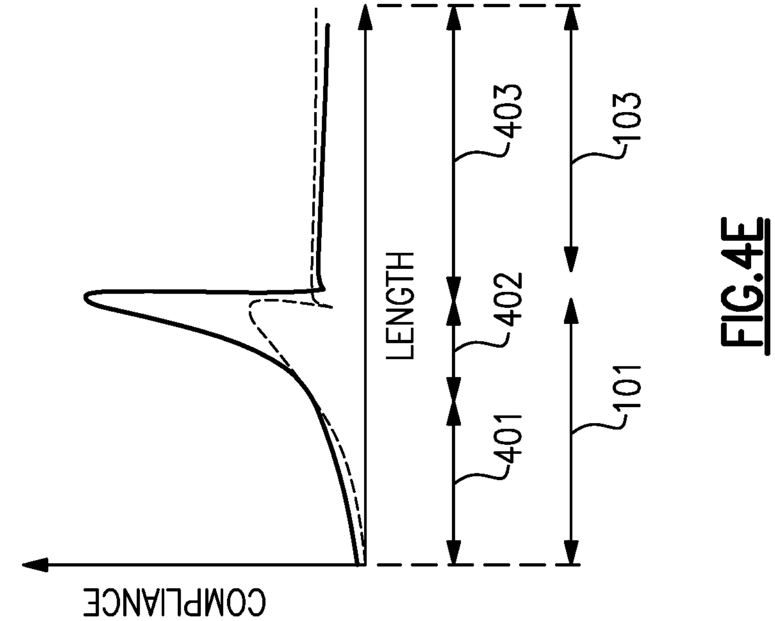
FIG. 4E is a graph showing compliance of a known sensor vs a sensor according to aspects of the present disclosure.

FIG. 4E illustrates the change in compliance of an embodiment of the sensor disclosed herein along the length of the sensor, as shown by the solid line. A comparison is shown with the known sensor, shown by the dashed line. It will be appreciated that this graph is a general result of the presence of the thinned second region, as described in the embodiments of FIGS. 4A-4D, and the exact values of the compliance may vary between each of the embodiments of FIGS. 4A-4D, and the graph of FIG. 4E is only for illustrative purposes. As shown, the compliance increases with distance away from the anchor throughout the first region 401, in a similar way to the first region of the known sensor. However, in embodiments of the sensor according to the present disclosure, the compliance continues to increase throughout the second region 402. The compliance of the second region 402 increases with distance from the anchor at a faster rate than the compliance of the first region 401. As shown, the second region of embodiments of the sensor according to the present disclosure has a maximum compliance at the outer edge of the second region 402, where the compliance is around 3 or 4 times larger than the maximum compliance of the known sensor.

As shown in FIG. 4E, the compliance decreases almost vertically between the second 402 and third region 403, such that in the third region 403 the compliance is lower than in the second region. The compliance stays substantially the same value along the length of the third region 403. The compliance of the third region 403, i.e., the passive region, is slightly lower than the compliance of the passive region 103 of the known arrangement. Embodiments of the sensor of the present disclosure has a compliance in its first region which is substantially the same as the compliance of the first region of the known sensor. This is because the piezoelectric layers have the same combined thickness in both the known sensor and the sensor of the known arrangement. The second region of embodiments of the sensor of the present disclosure has a compliance which increases more rapidly with distance from the anchor in its second region 402 than in the first region 401 as the second region comprises a thinner piezoelectric layer than the first region 401. The passive region of both the known sensor 103 and embodiments of the sensor of the present disclosure 403 have low compliances as they have a higher stiffness than the active region(s).

The embodiments described in relation to FIGS. 4A to 4F achieve different compliances in two regions by selecting different thicknesses of sensor material in those two regions. In an alternative embodiment, the difference in compliance may be achieved by selection of different materials for the two regions as will now be described.

Figure 4F:
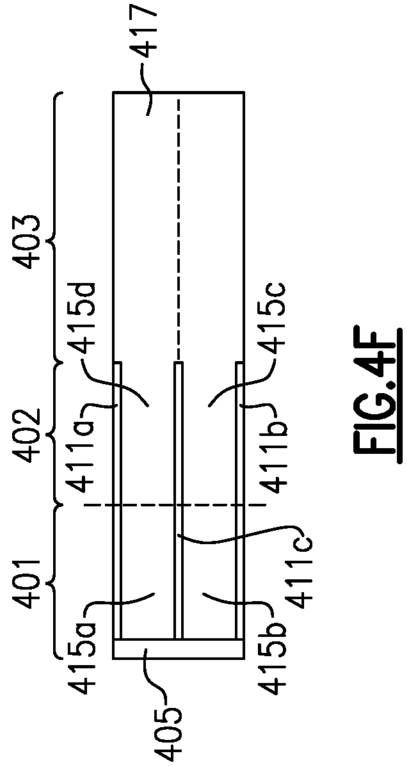
FIG. 4F-4G are sensors according to aspects of the present disclosure.

FIG. 4F shows an embodiment in which the first 401 and second 402 regions may be substantially the same thickness, but the first and second regions have different compliances. For example, the at least one piezoelectric layer and the at least one electrode layer of both of the first and second regions of the sensor may be the same thickness. As shown, first region 401 is the same thickness as second region 402. It is also shown that the third region, 403, is the same thickness as regions 401 and 402. However, in other embodiments the third region 403 may be a different thickness than regions 401 and 402. The piezoelectric layers, 415*a* and 415*b* of the first region may be comprised of a first material. The piezoelectric layers 415*c* and 415*d* of the second region may be comprised of a second material. To achieve the different compliances in the first 401 and second regions 402, the first and second materials are different. The second material is chosen such that it results in a higher compliance in the second region, than the compliance in the first region. The third region 403 is formed from material 417. Material 417 may be either of the first or second materials, or may be a non-piezoelectric material, as in other embodiments described herein.

Figure 4G:
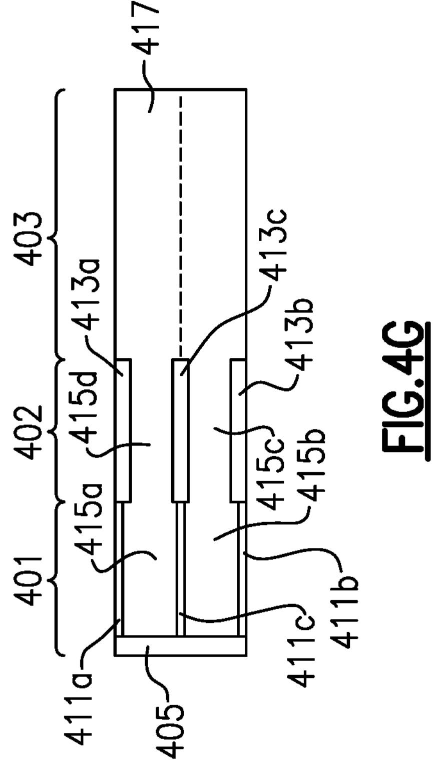

FIG. 4G shows an embodiment in which, the first 401 and second 402 regions may be substantially the same thickness, but the first and second regions have different compliances. As shown in FIG. 4G, the combination of the electrode layers and piezoelectric layers of the first region has the same thickness as the combination of the electrode layers and piezoelectric layers of the second region. However, as shown, in this embodiment the piezoelectric layers 415*a* and 415*b* of the first region may have a different thickness than the piezoelectric layers 415*c* and 415*d* of the second region. In this embodiment, the electrode layers 411*a*, 411*b*, and 411*c* of the first region have a smaller thickness than the electrode layers 413*a*, 413*b*, and 413*c* of the second region. Therefore, the piezoelectric layers of the first region have a greater thickness than the piezoelectric layers of the second region. It will also be appreciated that in other embodiments the first region may have thicker electrodes than the second region, and the second region may have thicker piezoelectric layers than the first region. The combined thickness of the electrode and piezoelectric layers of the first region, and the combined thickness of the electrode and piezoelectric layers of the second region are substantially the same. Additionally, the piezoelectric and/or electrode layers of each of the first and second regions may be different materials, to further vary the compliance of the first and second regions, as discussed in relation to FIG. 4F.

A sensor according to the present disclosure, such as the sensor according to any of the embodiments described herein, may be manufactured by the following techniques. It will be appreciated that the manufacturing of the different embodiments of FIGS. 4A-4D which have regions of differing thickness will comprises different numbers of steps, which may be in a different order to those described herein. Therefore, the manufacturing steps as described here are not limiting, and are to describe the general techniques which may be used. An advantage of embodiments of the sensor disclosed herein is that the sensor does not require more complicated steps than the manufacture of the known sensor. The steps for manufacturing will be described using the features as numbered in FIG. 4A, for illustrative purposes.

The steps for manufacturing an embodiment of the sensor disclosed herein include at least the steps of, depositing at least one piezoelectric layer 415*b* on a substrate, such that the piezoelectric layer has a greater thickness at a first region 401 than a second region 402.

FIGS. 11A-11G show cross-sectional views of the steps of one example of a method which may be used for manufacturing a sensor of the present disclosure. It will be appreciated that similar methods may be used to manufacture other embodiments disclosed herein. In these steps, a sensor as described in FIGS. 4A and 4B is manufactured. To illustrate the process steps, the steps will be described in relation to a first 1101 and second region 1102. It will be appreciated that the formation of the third region will not be described here, but will further include deposition of material on a substrate.

Figures 11E, 11F, 11G:
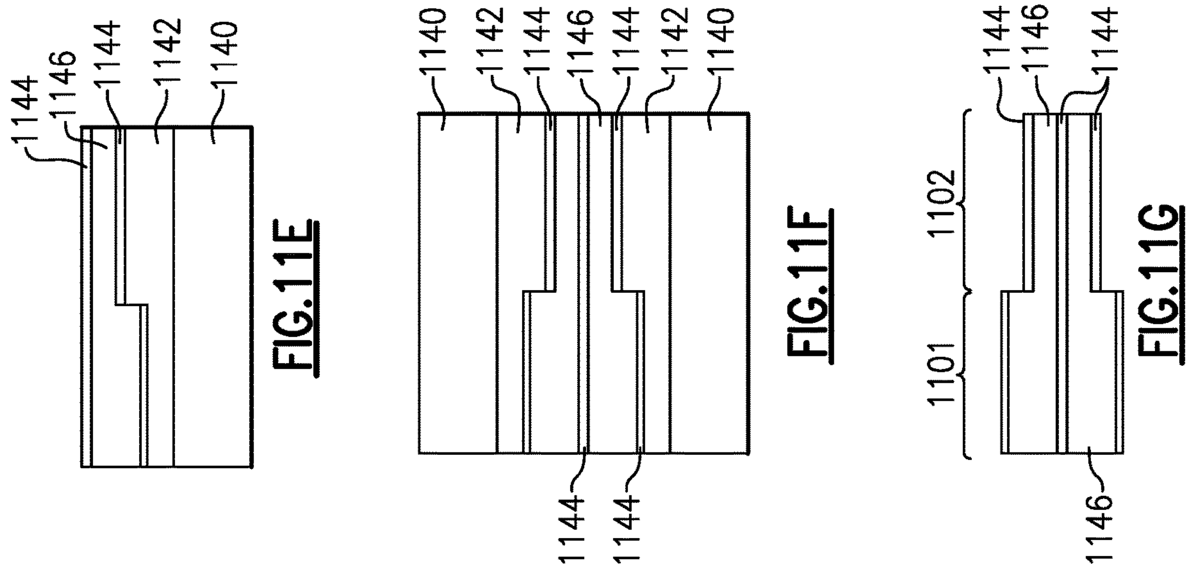
FIG. 11A-11G show steps of manufacturing a sensor according to aspects of the present disclosure.
Figures 11A, 11B, 11C, 11D:
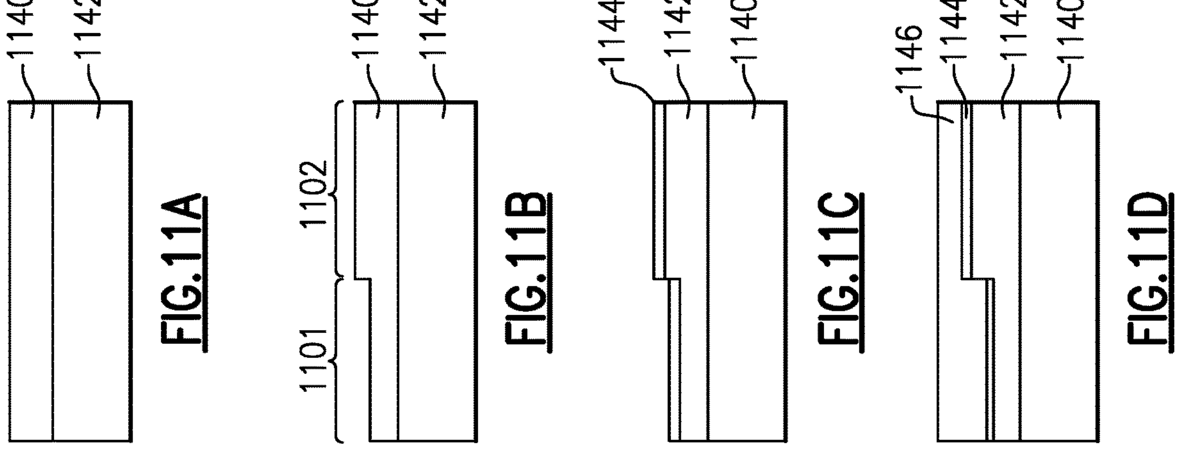

In the first step, shown in FIG. 11A, a substrate 1140 is oxidized to form an oxide layer 1142. The substrate may be composed of silicon, and the oxide layer composed of silicon dioxide. The oxidization step may be thermal oxidization.

In the second step, as shown in FIG. 11B, the oxide layer 1142 is etched at part of the substrate which corresponds to the first region of the sensor. The silicon dioxide is etched using an etchant which does not etch the silicon. Any suitable etchant may be used, such as hydrofluoric acid (HF). The etch is a partial etch, such that at the first region of the sensor, the silicon dioxide layer 1142 has a reduced thickness, without being completely removed. Therefore, no area of the silicon substrate 1140 is exposed in this step. It will be appreciated that in an embodiment wherein the sensor comprises a third region, the thickness of the third region may be formed by the etching, or absence of etching the silicon dioxide layer 1142 in this step.

In the next step, as shown in FIG. 11C, a metal layer 1144 is deposited on the silicon dioxide 1142. This metal layer 1144 forms a top/bottom electrode. The electrode 1144 may deposited with a thickness of around 30 nm. The electrode covers the entirety of the silicon dioxide layer 1142, such that an electrode 1144 is formed at both the first 1101 and second regions 1102 of the sensor.

In the next step, as shown in FIG. 11D, a piezoelectric layer 1146 is deposited on the electrode layer 1144. It will be appreciated that in an embodiment wherein the sensor comprises a third region formed from a piezoelectric layer, the piezoelectric layer of the third region may be deposited in this step. The piezoelectric layer 1146 is thinned at the second region 1102, which may be by etching, to result in a piezoelectric layer which is in line at the top of the first 1101 and second 1102 regions.

In the next step, as shown in FIG. 11E, a middle electrode 1144 is deposited in the first and second regions. This step completes the formation of a half structure.

In the next step, as shown in FIG. 11F, two half structures, as resulted in FIG. 11E, are bound such that the middle electrode layer 1144 of one half structure is in contact with and bound to a middle electrode layer 1144 of a second half structure. In other embodiments, the half structure of 11E, may be bound with a structure as formed in FIG. 11D, such that the piezoelectric layer 1146 of 11D is bound to the middle electrode layer 1144 of FIG. 11E. As shown, in FIG. 11F, the resultant structure has a first region 1101, and a thinned second region 1102.

In the next step, as shown in FIG. 11G, the silicon dioxide 1142 and silicon 1140 are removed. The silicon 1140 is etched first, using a suitable etchant which removes the silicon 1140 without removing the silicon dioxide 1142. Next, the silicon dioxide 1140 is etched, using an etchant which etches the silicon dioxide without etching the metal layers 1144.

The resultant structure is a sensor, as described in FIGS. 4A and 4B.

It will be appreciated, that the general techniques described in relation to FIGS. 11A-11G may be applied to form a sensor as described in FIGS. 4C and 4D. Although, it will be noted that there may be additional steps, such as steps described herein being repeated to form additional electrodes, and piezoelectric layers. Or, steps may be carried out in alternative orders to result in sensors of other embodiments.

In the embodiment of FIG. 4C, an additional material 419 is deposited after the deposition of the second electrode layer, in the half structure of FIG. 11E. It will be appreciated that this may be deposited in a single layer, wherein the additional material 419 is only deposited on one of the two half structures, which are then bound together. Alternatively, a layer of additional material 419 may be deposited on both of the half structures, such that the material 419 is composed of two layers.

In the embodiment of FIG. 4D, the method is as described in steps of FIGS. 11A-11G, with an additional electrode and piezoelectric layer deposited on each half stack, in the same way as described in the deposition of the other layers in FIGS. 11A-11E.

The process for manufacturing the embodiment of FIG. 4G will be similar to that of FIGS. 4A to 4F, but instead of selecting materials of different thickness, different materials may be used.

Figure 5:
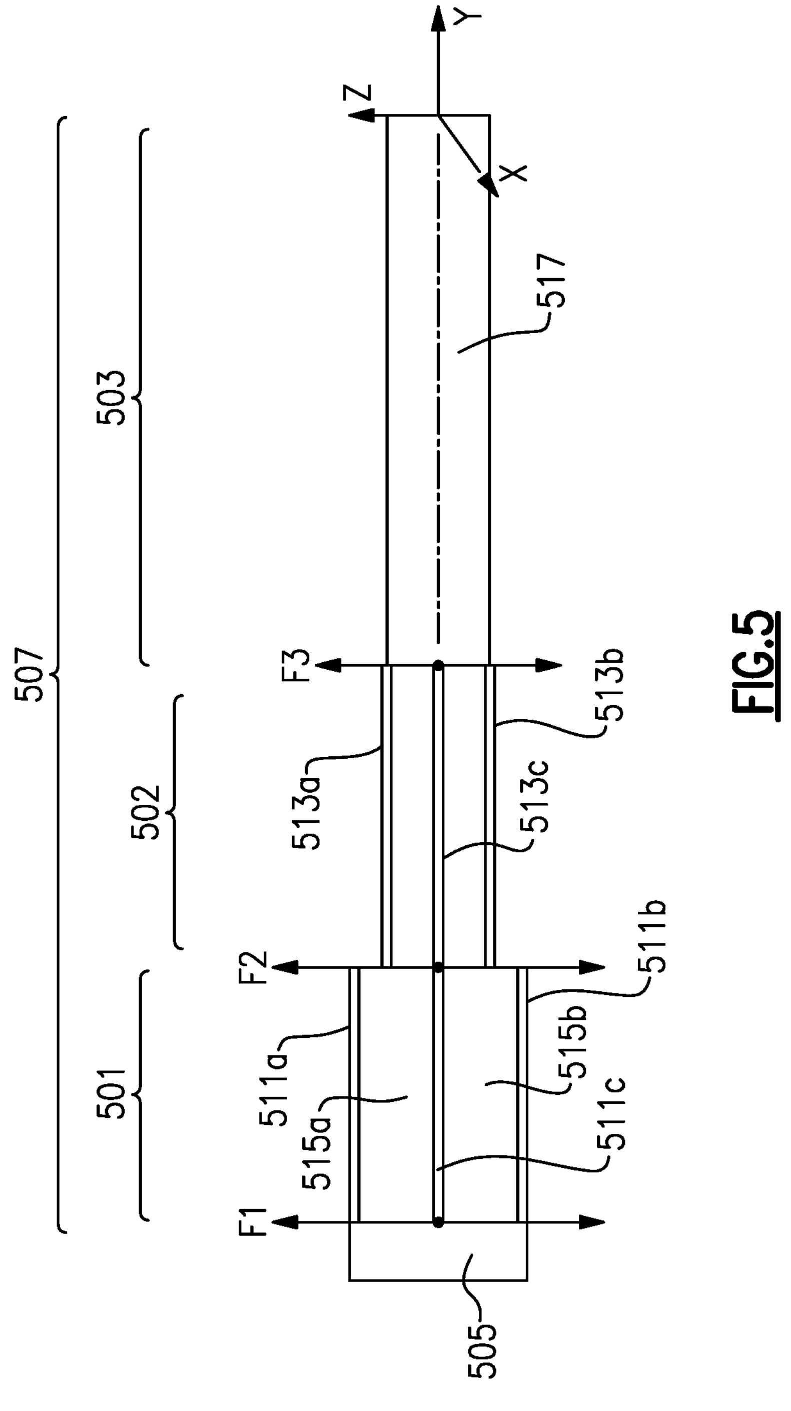
FIG. 5 is a sensor according to aspects of the present disclosure.

FIG. 5 illustrates the force at each of the regions, when a 1 Pa force is exerted on the sensor of an embodiment of the present disclosure. This applies to the embodiments in which compliance is changed by altering the thickness as well as to the embodiments in which compliance is changed be selecting different materials for the first and second regions. It will be noted that the embodiment of FIG. 5 is the same embodiment as FIG. 4B, and therefore the reader is directed to the description of FIG. 4B for a detailed description of the embodiment of FIG. 5. In the embodiment of FIG. 5, the piezoelectric layers of regions 501, 502, and 503 are composed of scandium doped aluminum nitride, Sc(0.18)AlN. The total thickness of the piezoelectric layers of the first region 501 is 300 nanometers. The electrodes layers of first region, 511*a*, 511*b*, and 511*c* may each have a thickness of 30 nanometers. The electrode layers of the second regions, 513*a*, 513*b*, and 513*c* may each have a thickness of 30 nanometers. The length of the sensor 507 is 400 micrometers. The piezoelectric layers of both of the second 502 and third 503 regions have a thinning coefficient, k, of 0.6. This is the factor of the thickness of the regions in comparison to the first region 501. Therefore, the second and third regions have a piezoelectric thickness of around 180-200 nm.

As shown, the force from an acoustic pressure is exerted at the joins between the first, second, and third regions due to the third region being supported by the second, the second being supported by the first, and the first being supported by the substrate wall 505. When a force is applied to the cantilevered sensor, the third region 503 interacts with the second region 502 with a force F3, and the second and third regions interact with the first region 501 with a force F2. The whole sensor interacts with the constraint at the substrate wall 505 with a force F1. The stress is induced in the sensor due to the force bending the sensor and thus creating stress. As the third region is stiff, the third region does not bend and instead its force is applied to the second region, where the stress creates charge which is collected by the electrodes and results in output voltage. The stress distribution and the amplitude of stress in the piezoelectric layers of the first and second regions depends on the applied force and compliance for each region. In an embodiment, as in FIG. 3B, wherein corrugations 309 are used to reduce the compliance of the third region, the compliance of the third region has the lowest compliance of the three regions. The first region has a compliance greater than the compliance of the third region but less than the second region, as the first region of the sensor comprises electrodes and piezoelectric layers. The second region of the sensor has the highest compliance of the three regions of the sensor, as the second region comprises electrodes and piezoelectric layers, however the piezoelectric layers are thinner than those of the first region. In other embodiments, such as the embodiment of FIG. 3A, wherein the third region does not comprise corrugations, the third region will have the greatest compliance. In some designs, $F1>F2>F3$, in others $F1=F2>F3$, and in others $F1<F2>F3$.

In FIGS. 6A, 6B, 6C and 6D plan views of a sensor are shown wherein the piezoelectric layers of regions 601 and 602 are composed of scandium doped aluminum nitride, Sc(0.18)AlN. The thickness of each of the piezoelectric layers of the first region 601 is 300 nanometers. The electrodes layers of first region may each have a thickness of 30 nanometers. The piezoelectric layers of the second and third regions are reduced by a coefficient of 0.6. The electrode layers of the second region may each have a thickness of 30 nanometers. The length of the sensor is 400 micrometers. The sensor of the present disclosure, whose displacement and stress are shown in FIGS. 6B and 6D respectively, may be a sensor according to any of the embodiments described herein. For modelling purposes, the embodiment of FIG. 4B was simulated in the model, whose results are shown in FIGS. 6A-6D, 7A-7B, and FIG. 8. The parameters used in the model are shown in the table of FIG. 6E.

As shown in the table of FIG. 6E, the piezoelectric layers of the first region each have a thickness of 300 nm. The second and third regions have piezoelectric layers with a thinning coefficient k=0.6, i.e., the second and third regions have piezoelectric layers with a thickness 0.6 of the thickness of the piezoelectric layers of the first region. The piezoelectric layers are composed of Sc(0.18)AlN. The electrode layers of the first and second regions each have a thickness of 30 nm, and are composed of aluminum. The sensor has a radius of 400 micrometers. The pressure applied to each of the sensors is 1 Pa.

FIG. 6A shows the displacement of the known sensor when a 1 Pa force is exerted on the sensor. FIG. 6B shows the displacement of a sensor according to the present disclosure when a 1 Pa force is also exerted on the sensor. As shown, with reference to the scales on the figures, the sensors have substantially the same displacement along the length of the sensor. As shown, the displacement increases along the length of the sensor, such that the free end 621 of the sensor has a greater displacement than the fixed end 623, as the sensor bends into or out of the cavity.

FIG. 6C shows the stress gradient of the known sensor, and FIG. 6D shows the stress gradient of a sensor according to the present disclosure.

As shown in FIG. 6C, for the sensor of the known arrangement, when a 1 Pa force is exerted on the sensor, there is one point of stress gradient centered on the fixed end of the sensor. The sensor is supported at an anchor region, not shown here, which is adjacent to the fixed end. There is no stress at the portion of the sensor which is overlapping the substrate wall, i.e., the anchor region, but adjacent to the anchor region, the sensor has a stress due to the bending of the sensor. The stress is maximum at this stress point, due to the force from the passive and active regions resulting in the sensor bending, creating stress at this point. The stress decreases along the length of the sensor, i.e., away from the anchor region.

As shown in FIG. 6D, the sensor according to the present disclosure, in which the active region is composed of a first 601 and second region 602, the sensor comprises two areas of stress gradient. The first area of stress gradient is centered on the fixed end 623 of the sensor, where the sensor has stress due to the bending of the sensor adjacent to the anchor region. The sensor also has a second area of stress gradient at the center of the join between the first and second regions. The area of stress occurs at this region due to the higher compliance, and thus higher bending of the sensor in the second region than in the first region. Therefore, the sensor has a stress region at the connection between these two regions. It will be appreciated that the second area of stress gradient arises due to the step in compliance distribution along the length of the cantilever as described in relation to FIGS. 4A-4D above, and would not arise if the change in compliance between regions were gradual.

Comparing the stress gradients of FIGS. 6C and 6D, it can be seen that the stress in the first region of the sensor according to the present disclosure is lower than the stress of the first region in the known sensor. This is due to stress being redistributed from the first region to the second region in the sensor of the present invention. Therefore the stress in its first region is lower.

FIG. 6E is a table comparing the parameters of the known sensor to those of a sensor according to the present disclosure. The electrodes may be optimized to improve the performance of the sensor. It has been appreciated that a larger electrode has a larger capacitance than a smaller electrode. However, as described herein, the stress and charge are distributed at the fixed region only. Therefore, an electrode placed at the third region would add to the parallel capacitance, without collecting charge. This parallel capacitance is also presented at the ASIC input and characterize parasitic capacitance. Therefore, it is advantageous to optimize the electrode size and shape. As shown by the table of FIG. 6E, the electrode of the known sensor has an optimization parameter, dr factor, of 0.7. The electrode coverage of the sensor is estimated as dr*R, wherein R is the length of the cantilever. Therefore, an electrode optimization parameter, dr=0.7, means that the electrode free region will be 0.7*R from the tip of the cantilever, and R-0.7*R=0.3*R is the electrode region of the sensor on which the electrode exists.

In the embodiment of FIGS. 6B and 6D the electrode of the first region has an electrode optimization parameter of 0.85, and the electrode of the second region has an electrode optimization parameter of 0.65. Therefore, the electrode of the second region covers 0.15*R of the sensor, and the electrode of the first region covers 0.35*R of the sensor. Therefore, embodiments of the sensor disclosed herein comprise electrodes covering a greater length of the sensor than in the known sensor. In other embodiments, the optimization parameters may be different, depending on materials used.

As shown in the table of FIG. 6E, the sensor according to the present disclosure, having the electrode optimization parameters as described above, results in an output voltage of 1.07 mV for the second region and 1.27 mV for the first region. The voltage is higher in the first region than the second due to the sensor having a greater capacitance in the second region of the sensor than in the first region. The known sensor has an output voltage of 1 mV. Therefore, embodiments of the sensor of the present disclosure produce a larger output voltage than the known sensor. In some embodiments in which the electrodes of the first and second regions have the same output voltage the electrodes may be connected in parallel.

The resonant frequency of the known sensor is 13.993 kHz, whereas the resonant frequency of the sensor according to the present disclosure is 11.074 kHz.

Figure 7B:
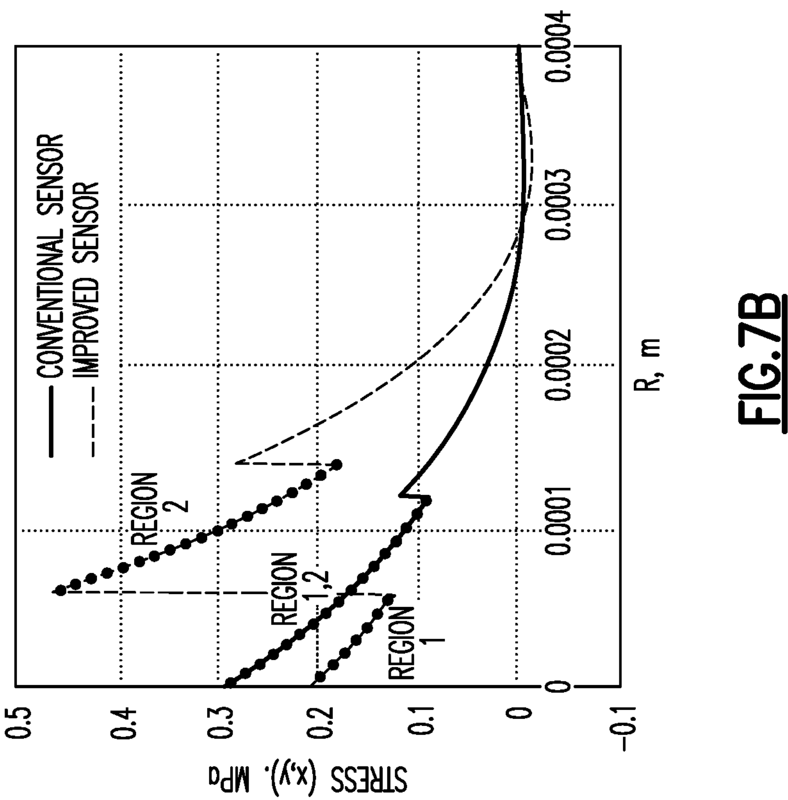
FIG. 7B shows the x-y stress of a known sensor and a sensor according to aspects of the present disclosure.
Figure 7A:
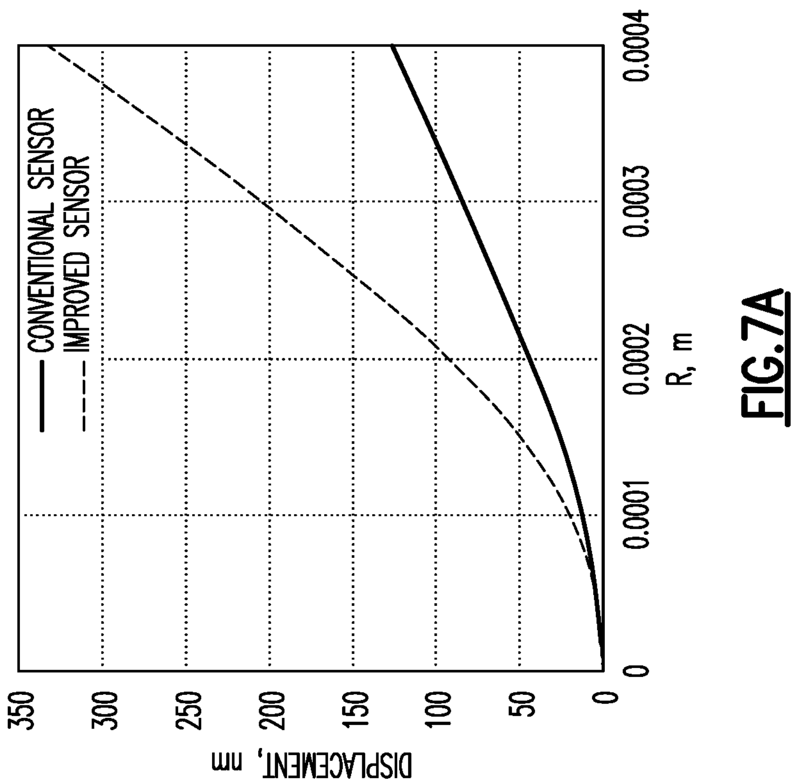
FIG. 7A shows the total displacement of a known sensor and a sensor according to aspects of the present disclosure.

FIG. 7A shows a graph comparing the displacement profile measured along a bent cantilever structure of the known sensor ("conventional sensor") to a sensor according to the present disclosure ("improved sensor"). It will be appreciated that the "improved sensor" as referred to in this figure may be any of the sensors described herein. As shown, the displacement of the known sensor and of the sensor of the present disclosure increase along the length of the sensor as shown by the x-axis 'R'. The known sensor has a minimum displacement of 0 nm that increases to a maximum displacement of around 125 nm at a distance of 0.4 mm from the anchor of the sensor. Whereas the sensor according the present disclosure has a minimum displacement of 0 nm which increases to a maximum displacement of around 330 nm at a distance of 0.4 mm from the anchor of the sensor. Therefore, the sensor according to the present disclosure has a higher compliance than the known sensor.

FIG. 7B shows a graph comparing the stress of the known sensor ("conventional sensor") to a sensor according to the present disclosure ("improved sensor"). It will be appreciated that the "improved sensor" as referred to in this figure may be any of the sensors described herein according to the present disclosure. As shown, the stress is increased in the active regions of the sensors as compared to in the passive regions. The known sensor has an active region comprising a single region, here labelled Region 1 on the line of the conventional sensor. It will be seen that the stress decreases along the length of the active region. The sensor has a maximum stress of 0.3 MPa at the edge of the active region, Region 1, which decreases to around 0.1 MPa at the edge of the sensor adjacent to the passive region. The stress continues to decrease with length along the passive region, such that the stress is 0 MPa at around 0.1 mm from the free end of the sensor.

Embodiments of sensors according to the present disclosure comprise two active regions. The first region of the sensor is labelled on FIG. 7B as Region 1, and the second region is labelled as Region 2. As shown, the first region has a stress that is lower than the stress in the second region, and that is lower than in the active region of the known sensor. The stress in the first region is around 0.2 MPa at the edge of the first region, at which edge the sensor is supported by the substrate wall. The stress decreases with length along the first region. At the connection between the first and second regions, the stress steps up such that the stress at the edge of region 1 is around 0.1 MPa, whereas the stress at the edge of the second region is around 0.45 MPa. Along the length of the second region, the stress decreases to around 0.19 MPa. The stress decreases along the length of the second region more rapidly than along the length of the first region, and also more rapidly that the decrease in stress in the active region of the known sensor. At the connection between the second region and third region, the stress increases in a step, such that at the edge of the second region the stress is around 0.19 MPa, whereas at the edge of the third region the stress is around 0.28 MPa. The stress decreases along the length of the third region, such that the stress decreases to 0 MPa around 0.1 mm from the free end of the sensor. However, the stress in the passive region, i.e., the third region of the improved sensor decreases more rapidly than the stress in the passive region of the known sensor.

Figure 8:
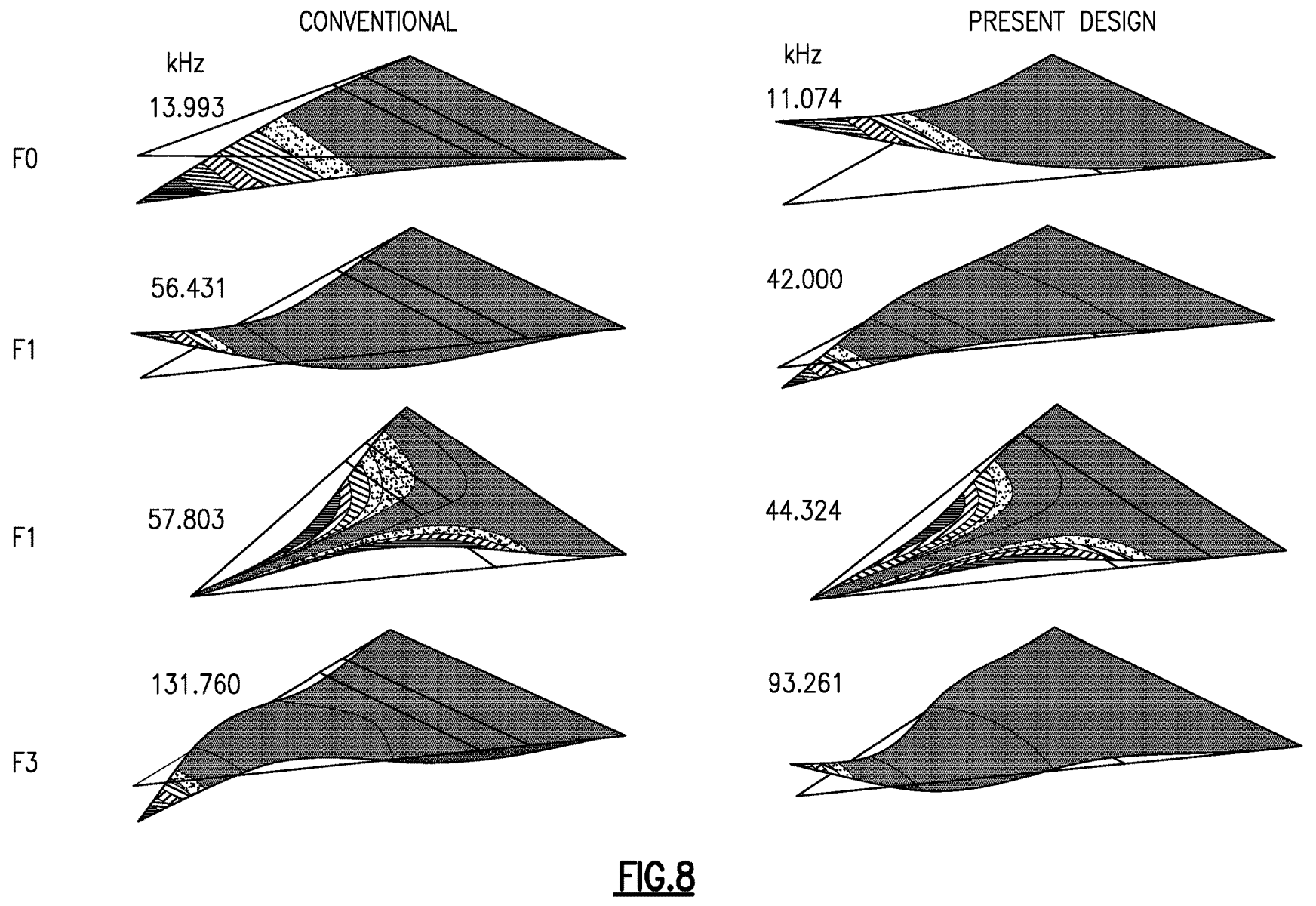

FIG. 8 shows the resonant frequency, F0, first harmonic, F1, second harmonic, F2, and third harmonic F3 of both the known ("conventional") sensor and an embodiment of the sensor of the present disclosure ("present design"). The contours illustrate the frequency of the harmonics along the sensor. As shown, a sensor according to the present disclosure has a lower resonant frequency which arises due to the increased compliance of the sensor. However, this difference may be compensated for by a different pattern or design of the sensor. The higher ordered harmonics may couple with the resonant frequency, F0, main mode and the sensor performance may degrade near the resonant frequency. However, this may have only a low impact on the sensitivity of the microphone, which is often measured at a much lower frequency than F0. Another problem may appear when high order modes are coupled to this distortion and the sensor may be easily broken at some high power or noise source. To prevent this potential issue a wide range response should be analyzed. This may be important for complex or combined vibration mechanical systems.

Figure 9A:
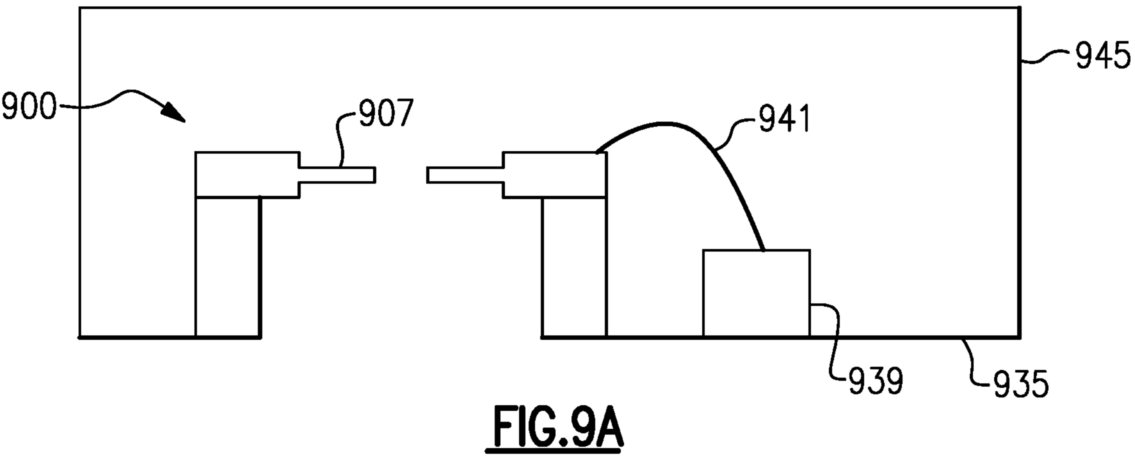
FIG. 9A-9B show a packaged microphone in accordance with the present disclosure.

FIG. 9A illustrates a cross-sectional view of a microphone arrangement. It will be appreciated that this is an example embodiment for illustrative purposes, and embodiments of the sensor disclosed herein can be included in a variety of different microphone arrangements. As illustrated, the microphone 900 of FIG. 9A is located within a cap 945. The microphone 900 may be the microphone of any embodiment as described herein. In this arrangement, the microphone 900 comprises multiple sensors, wherein each sensor comprises a second region with a thickness less than a first region, as described herein. The cap 945 may be flexible or rigid, and may be any suitable material, such as a metallic material. The cap creates a seal with a substrate 935 (for example, a printed circuit board), such that air only flows into and out of the arrangement via a sound inlet. The substrate 935 may be any suitable material. The cap 945 also mitigates electromagnetic interference. Sound waves enter the arrangement, causing the sensor 907 to bend and produce voltage due to the piezoelectric effect, as described herein. The microphone arrangement further comprises an application specific integrated circuit chip/die ("ASIC") 939. The MEMS microphone is electrically connected to the ASIC 939 by wire bonding 941. Although not shown, it will be appreciated that the wire bonding may be connected to the one or more electrodes of the sensor, as described herein.

Figure 9B:
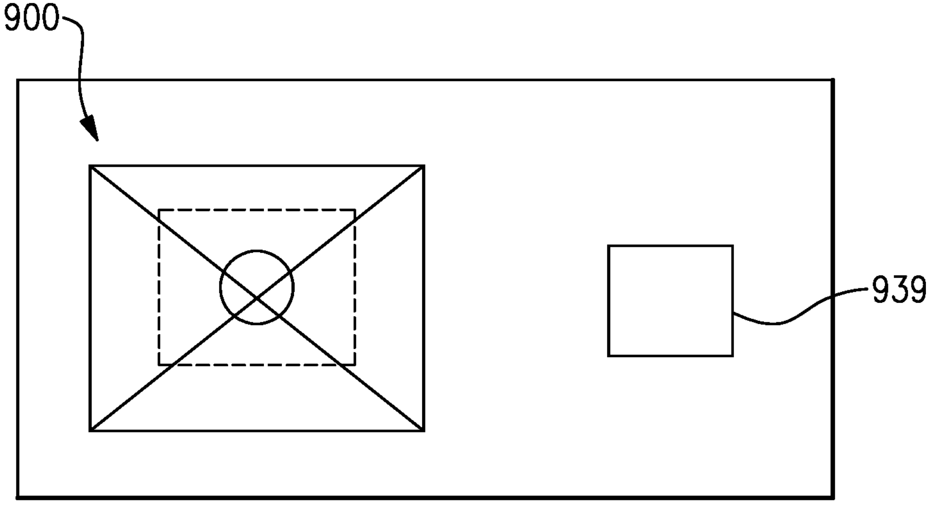

FIG. 9B illustrates a plan view of a microphone arrangement. The triangular cantilevers are shown, and the outline of the cavity is also shown by a dashed line. The ASIC 939 is shown adjacent to the microphone 900. The circle in the figure shows the sound input cavity, and the rectangle is the die of the sensor element.

It will be appreciated that although embodiments of the sensor of the present disclosure have been described as embodiments comprising a cantilevered sensor, the sensor may be a membrane sensor. In embodiments comprising a membrane sensor the sensor comprises a second region away from the anchor region, wherein the second region has a thickness less than the thickness of a first region, wherein the first region is adjacent to the anchor region.

It also be appreciated, that although embodiments of the sensor of the present disclosure have been described as embodiments in which the sensor comprises a first and second region, forming an active region, and a third region forming the passive region, the sensor may comprise further regions. For example, the active region may be split into three or four regions. This would have the result of creating additional areas of stress along the sensor, and may increase the compliance of the sensor. The design and manufacture of this sensor would be as described herein in relation to two sections of active region.

However, we have appreciated that an active region split into two regions provides the best compromise of increased compliance, and increased performance of the sensor, whilst ensuring that the sensor is strong enough to not break with large external sound pressures. It has been appreciated that if the sensor is too thin, the sensor is weaker.

Figure 10:
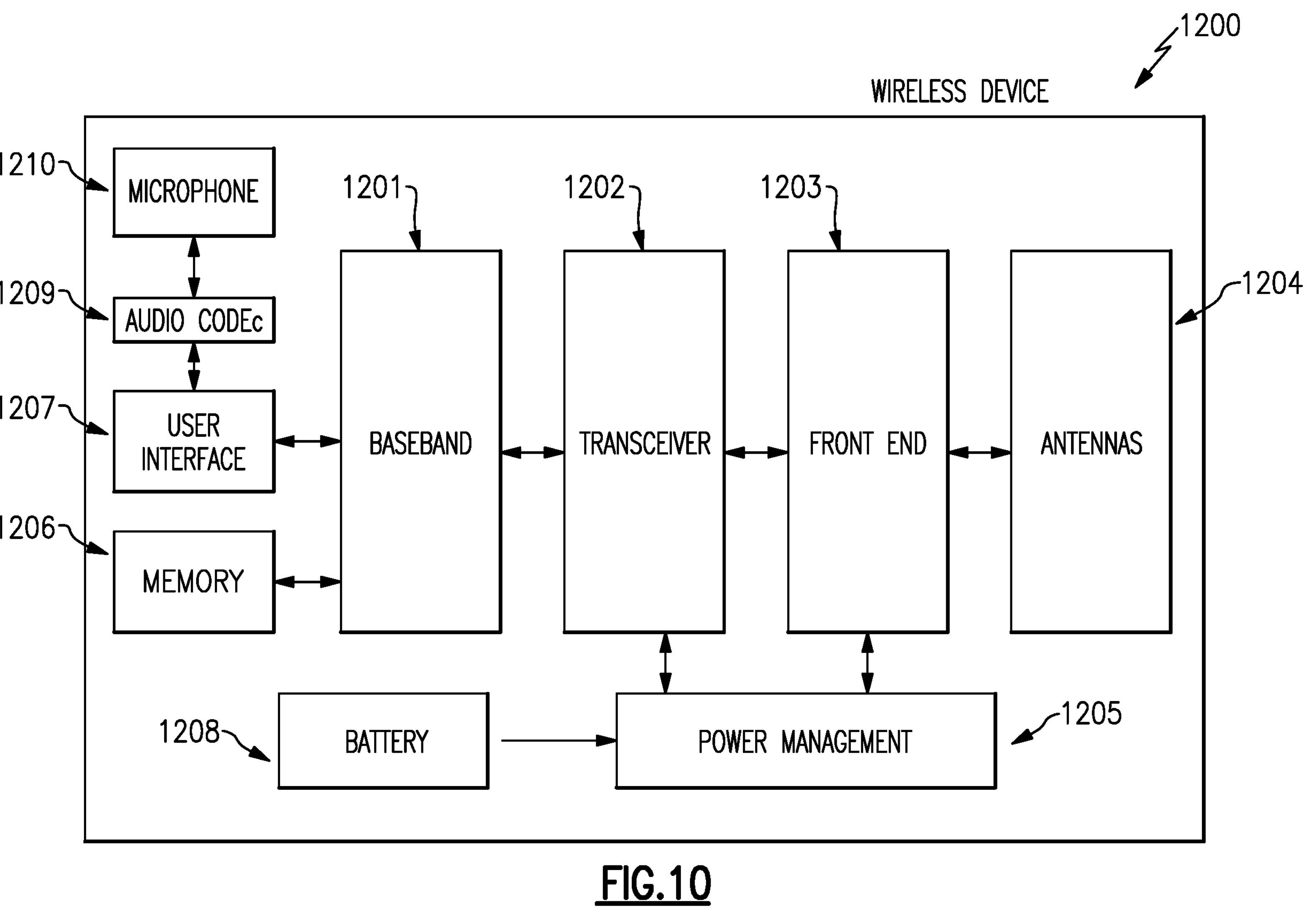
FIG. 10 shows a schematic of a wireless device in accordance with the present disclosure.

FIG. 10 is a schematic diagram of one embodiment of a wireless device 1200. The wireless device can be, for example but not limited to, a portable telecommunication device such as, a mobile cellular-type telephone. The wireless device includes a microphone arrangement 1210, including an improved sensor as described herein, and may include one or more of a baseband system 1201, a transceiver 1202, a front end system 1203, one or more antennas 1204, a power management system 1205, a memory 1206, a user interface 1207, a battery 1208, and audio codec 1209. The microphone arrangement may supply signals to the audio codec 1209 which may encode analog audio as digital signals or decode digital signals to analog. The audio codec 1209 may transmit the signals to a user interface 1207. The user interface 1207 transmits signals to the baseband system 1201. The transceiver 1202 generates RF signals for transmission and processes incoming RF signals received from the antennas.

The transceiver 1203 aids in conditioning signals transmitted to and/or received from the antennas 1204.

The antennas 1204 can include antennas used for a wide variety of types of communications. For example, the antennas 1204 can include antennas 1204 for transmitting and/or receiving signals associated with a wide variety of frequencies and communications standards.

The baseband system 1201 is coupled to the user interface to facilitate processing of various user input and output, such as voice and data. The baseband system 1201 provides the transceiver 1202 with digital representations of transmit signals, which the transceiver 1202 processes to generate RF signals for transmission. The baseband system 1201 also processes digital representations of received signals provided by the transceiver 1202. As shown in FIG. 10, the baseband system 1201 is coupled to the memory to facilitate operation of the wireless device.

The memory can be used for a wide variety of purposes, such as storing data and/or instructions to facilitate the operation of the wireless device and/or to provide storage of user information.

The power management system 1205 provides a number of power management functions of the wireless device.

The power management system 1205 receives a battery voltage from the battery 1208. The battery 1208 can be any suitable battery for use in the wireless device, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A piezoelectric microelectromechanical systems microphone comprising:
- a sensor;
- an anchor region at which the sensor is supported by a substrate;
- a first region of the sensor adjacent to the anchor region, the first region having at least one piezoelectric layer and at least one electrode;
- a second region of the sensor, the second region being adjacent to the first region, having at least one piezoelectric layer and at least one electrode, and having a thickness less than the thickness of the first region, at least one of an upper surface of the sensor or a lower surface of the sensor having a vertical step at a point of connection between the first region of the sensor and the second region of the sensor; and
- a third region of the sensor, having at least one layer of material, wherein the third region is adjacent to the second region but not adjacent to the first region.

2. The piezoelectric microelectromechanical systems microphone of claim 1 wherein the at least one piezoelectric layer of the second region of the sensor has thickness less than the thickness of the at least one piezoelectric layer of the first region of the sensor.

3. The piezoelectric microelectromechanical systems microphone of claim 1 wherein the at least one electrode of the second region of the sensor has a thickness less than the thickness of the at least one piezoelectric layer of the first region of the sensor, and a single piezoelectric layer forms the at least one piezoelectric layer of the first region and the at least one piezoelectric layer of the second region.

4. The piezoelectric microelectromechanical systems microphone of claim 1 wherein the at least one layer of material is a piezoelectric material.

5. The piezoelectric microelectromechanical systems microphone of claim 1 wherein the at least one layer of material is a metal.

6. The piezoelectric microelectromechanical systems microphone of claim 1 wherein the at least one layer of material is a low density material.

7. The piezoelectric microelectromechanical systems microphone of claim 1 wherein the third region has a thickness equal to the thickness of the second region.

8. The piezoelectric microelectromechanical systems microphone of claim 1 wherein the third region has a thickness different from the thickness of the second region.

9. The piezoelectric microelectromechanical systems microphone of claim 1 wherein the third region comprises at least one corrugation.

10. The piezoelectric microelectromechanical systems microphone of claim 1 wherein the second region comprises two piezoelectric layers and three electrode layers, where one of the electrode layers is a middle electrode located between the two piezoelectric layers, the first region comprises two piezoelectric layers and three electrode layers, where one of the electrode layers is a middle electrode located between the two piezoelectric layers, and the middle electrode of the first region and the middle electrode of the second region are the same electrode layer.

11. The piezoelectric microelectromechanical systems microphone of claim 10 wherein the first region comprises four electrodes, two piezoelectric layers and at least one layer of non-piezoelectric material, one of the electrode layers of the first region is connected to an upper electrode of the second region, and another one of the electrode layers of the first region is connected to a lower electrode of the second region.

12. The piezoelectric microelectromechanical systems microphone of claim 10 wherein the first region comprises five electrode layers and four piezoelectric layers, one of the electrode layers of the first region is connected to an upper electrode of the second region, and another one of the electrode layers of the first region is connected to a lower electrode of the second region.

13. The piezoelectric microelectromechanical systems microphone of claim 1 wherein the at least one piezoelectric layer of the first region and/or the at least one piezoelectric layer of the second region is composed of aluminum nitride.

14. The piezoelectric microelectromechanical systems microphone of claim 1 wherein the at least one electrode of the first region is composed of a different metal than the at least one electrode of the second region.

15. The piezoelectric microelectromechanical systems microphone of claim 1 wherein the first region comprises three electrodes, two of which are connected in parallel.

16. The piezoelectric microelectromechanical systems microphone of claim 1 wherein the sensor is a cantilever sensor.

17. The piezoelectric microelectromechanical systems microphone of claim 1 wherein the sensor is a membrane sensor.

18. The piezoelectric microelectromechanical systems microphone of claim 1 wherein the first region of the sensor and the second region of the sensor define an active region of the sensor, and the third region of the sensor defines a passive region of the sensor.

19. The piezoelectric microelectromechanical systems microphone of claim 1 wherein upper and lower surfaces of the sensor each have a vertical step at a point of connection between the second region of the sensor and the third region of the sensor.

20. A wireless mobile device comprising:
- one or more antennas;
- a front end system that communicates with the one or more antennas; and
- one or more piezoelectric microelectromechanical systems microphones, each microphone including a sensor, an anchor region at which the sensor is supported by a substrate, a first region of the sensor adjacent to the anchor region, the first region having at least one piezoelectric layer and at least one electrode, and a second region of the sensor, the second region being adjacent to the first region, having at least one piezoelectric layer and at least one electrode, and having a thickness less than the thickness of the first region, upper and lower surfaces of the sensor each having a vertical step at a point of connection between the first region of the sensor and the second region of the sensor.

* * * * *